United States Patent
Elia et al.

(10) Patent No.: US 9,310,457 B2
(45) Date of Patent: Apr. 12, 2016

(54) BASELINE MANAGEMENT FOR SENSING DEVICE

(71) Applicant: Synaptics Incorporated, Santa Clara, CA (US)

(72) Inventors: Curtis Elia, San Carlos, CA (US); Adam Schwartz, Redwood City, CA (US)

(73) Assignee: Synaptics Incorporated, San Jose, CA (US)

( * ) Notice: Subject to any disclaimer, the term of this patent is extended or adjusted under 35 U.S.C. 154(b) by 509 days.

(21) Appl. No.: 13/801,911

(22) Filed: Mar. 13, 2013

(65) Prior Publication Data

US 2014/0278173 A1  Sep. 18, 2014

(51) Int. Cl.
*G01R 35/00* (2006.01)
*G06F 3/044* (2006.01)
*G06F 3/041* (2006.01)

(52) U.S. Cl.
CPC .............. *G01R 35/007* (2013.01); *G06F 3/044* (2013.01); *G06F 3/0418* (2013.01)

(58) Field of Classification Search
CPC ...................................................... G06F 3/044
USPC .......................................................... 702/65
See application file for complete search history.

(56) References Cited

U.S. PATENT DOCUMENTS

| 5,053,757 | A | 10/1991 | Meadows |
|---|---|---|---|
| 6,904,570 | B2 | 6/2005 | Foote et al. |
| 7,986,313 | B2 | 7/2011 | Krah |
| 8,330,474 | B2 | 12/2012 | Vandermeijden |
| 2006/0221061 | A1 | 10/2006 | Fry |
| 2006/0227115 | A1 | 10/2006 | Fry |
| 2007/0262969 | A1 | 11/2007 | Pak |
| 2008/0157893 | A1 | 7/2008 | Krah |
| 2008/0158169 | A1 | 7/2008 | O'Connor et al. |
| 2008/0158182 | A1 | 7/2008 | Westerman |
| 2008/0246723 | A1 | 10/2008 | Baumbach |
| 2008/0309625 | A1 | 12/2008 | Krah et al. |
| 2008/0309628 | A1 | 12/2008 | Krah et al. |
| 2008/0309631 | A1 | 12/2008 | Westerman et al. |
| 2009/0213081 | A1 | 8/2009 | Case, Jr. |
| 2010/0292945 | A1 | 11/2010 | Reynolds et al. |
| 2011/0007021 | A1 | 1/2011 | Bernstein et al. |

(Continued)

OTHER PUBLICATIONS

International Search Report and Written Opinion in corresponding International Application No. PCT/US2014/026607, mailed Jul. 18, 2014 (12 pages).

*Primary Examiner* — Bryan Bui
(74) *Attorney, Agent, or Firm* — Osha Liang LLP

(57) ABSTRACT

A processing system for baseline management includes a sensor module comprising sensor circuitry coupled to sensor electrodes, where the sensor module is configured to receive resulting signals with at least a portion of the sensor electrodes. The processing system further includes a determination module operatively connected to the sensor electrodes. The determination module is configured to obtain a first profile from the resulting signals, calculate, using the first profile, a first statistic and a second statistic for the first profile, and select, according to a first range of the first statistic and a second range of the second statistic, a baseline relaxation technique from a plurality of baseline relaxation techniques to obtain a selected baseline relaxation technique. The determination module is further configured to adjust a baseline for the capacitance sensing input device according to the selected baseline relaxation technique.

20 Claims, 14 Drawing Sheets

(56) References Cited

U.S. PATENT DOCUMENTS

| | | |
|---|---|---|
| 2011/0025629 A1 | 2/2011 | Grivna et al. |
| 2011/0148438 A1 | 6/2011 | Dattalo |
| 2011/0216016 A1 | 9/2011 | Rosener |
| 2012/0050211 A1 | 3/2012 | King et al. |
| 2012/0229418 A1 | 9/2012 | Schwartz et al. |
| 2012/0283972 A1 | 11/2012 | Vandermeijden |
| 2014/0062938 A1* | 3/2014 | Bulea ............................ 345/174 |

* cited by examiner

BASELINE MANAGEMENT FOR SENSING DEVICE

CROSS REFERENCE TO RELATED APPLICATIONS

The present application contains subject matter that may be related to the subject matter in the following U.S. Patent Application, which is assigned to a common assignee, has the same inventors as the present application, and is incorporated by reference in its entirety: U.S. patent application Ser. No. 13/801,879, issued as U.S. Pat. No. 9,035,906, entitled "PROXIMITY SENSING", being filed concurrently herewith.

FIELD

This invention generally relates to electronic devices.

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

In general, in one aspect, embodiments relate to a processing system for baseline management. The processing system includes a sensor module comprising sensor circuitry coupled to sensor electrodes, where the sensor module is configured to receive resulting signals with at least a portion of the sensor electrodes. The processing system further includes a determination module operatively connected to the sensor electrodes. The determination module is configured to obtain a first profile from the resulting signals, calculate, using the first profile, a first statistic and a second statistic for the first profile, and select, according to a first range of the first statistic and a second range of the second statistic, a baseline relaxation technique from a plurality of baseline relaxation techniques to obtain a selected baseline relaxation technique. The determination module is further configured to adjust a baseline for the capacitance sensing input device according to the selected baseline relaxation technique.

In general, in one aspect, embodiments relate to a method for baseline management for a capacitive sensing device. The method includes obtaining a first profile from sensing signals received with sensor electrodes of the capacitance sensing input device, calculating, using the first profile, a first statistic and a second statistic for the first profile, and selecting, according to a first range of the first statistic and a second range of the second statistic, a baseline relaxation technique from a plurality of baseline relaxation techniques to obtain a selected baseline relaxation technique. The method further includes adjusting a baseline for the capacitance sensing input device according to the selected baseline relaxation technique.

In general, in one aspect, embodiments relate to an input device that includes sensor electrodes configured to receive sensing signals, and a processing system operatively connected to the sensor electrodes. The processing system is configured to obtain a profile from the resulting signals, calculate, using the profile, a first statistic and a second statistic for the profile, and select, according to a first range of the first statistic and a second range of the second statistic, a baseline relaxation technique from a plurality of baseline relaxation techniques to obtain a selected baseline relaxation technique. The processing system is further configured to adjust a baseline for the capacitance sensing input device according to the selected baseline relaxation technique.

Other aspects of the invention will be apparent from the following description and the appended claims.

DETAILED DESCRIPTION

Figure 1:
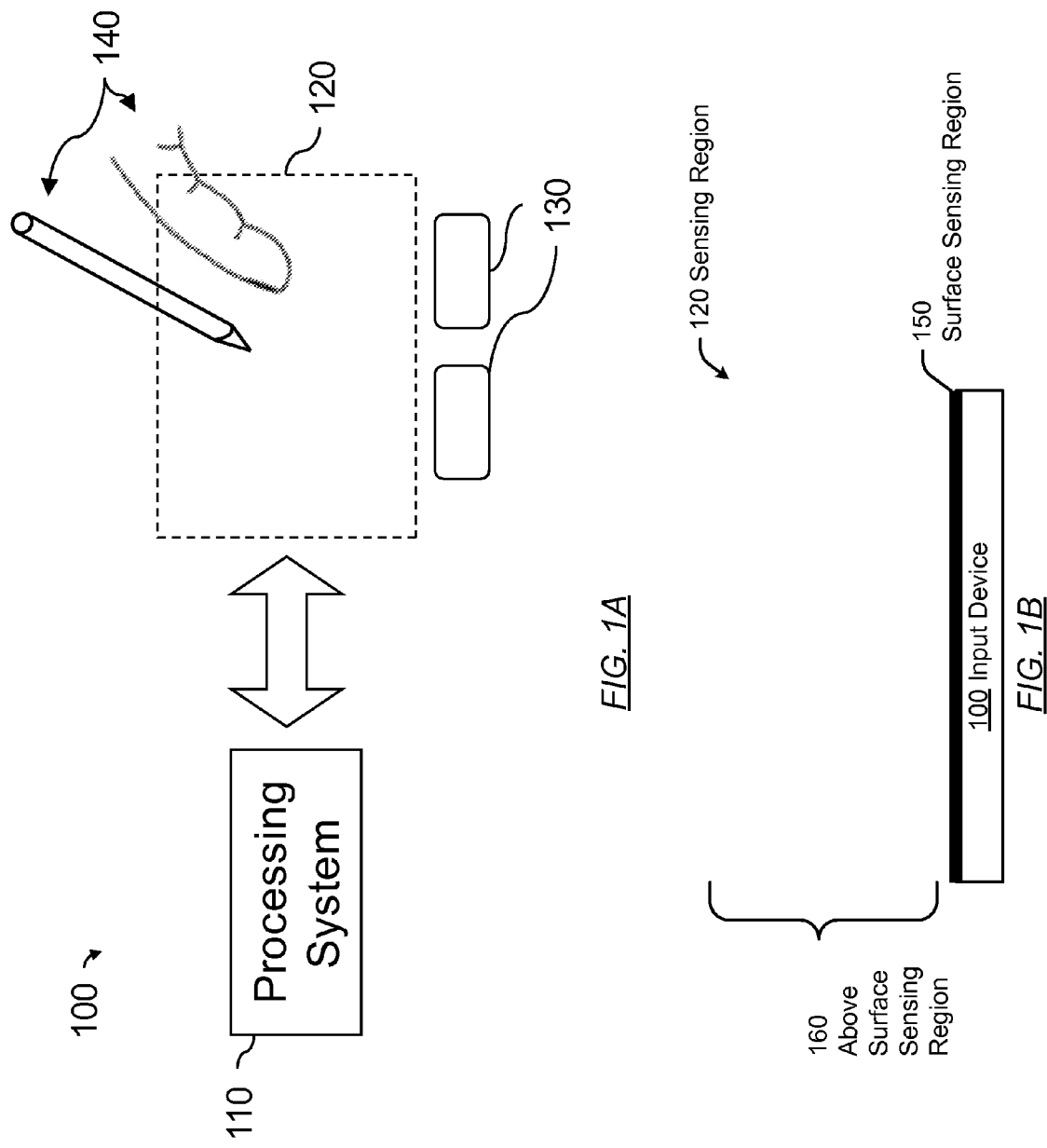
FIGS. 1A-1B show schematic diagrams in one or more embodiments of the invention.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention provide input devices and methods that facilitate improved usability. Specifically, one or more embodiments are directed to selecting a baseline relaxation technique to apply to a baseline for a capacitance sensing input device. More specifically, one or more embodiments calculate two or more statistics from a profile. According to ranges of the statistics, a baseline relaxation technique is selected and used to adjust the baseline.

In various embodiments, a baseline is an estimate of a background capacitance of a sensor device. The background capacitance of a sensor device is the capacitive frame associated without an input object in the sensing region. The background capacitance changes with the environment and operating conditions, and may be estimated in various ways. For example, some embodiments take "baseline frames" when no input object is determined to be in the sensing region, and those baseline images are used as estimates of background capacitance. The term baseline, as used herein, may be referred to as baseline images, baseline profiles, baseline measurements, baseline frames, or the like.

In one or more embodiments of the invention, baseline relaxation refers to the transitioning from a baseline to another baseline. Baseline relaxation is typically performed to adjust the baseline to account for the changes to the background capacitance based on environmental or operating condition changes. A baseline relaxation technique may refer to the speed at which the baseline is updated to account for the change in accordance with some embodiments. Baseline relaxation technique may additionally or alternatively refer to any equations used to adjust the baseline.

In one or more embodiments of the invention, a profile is any representation of data received by different sensor electrodes (discussed below and in FIG. 1A) of an input device (discussed below and in FIG. 1A). In one or more embodiments of the invention, a profile is an ordered set of measured data values, whereby each data value is obtained for a predefined region on an input device. In one or more embodiments of the invention, the profile includes a single measured data value for each sensor electrode represented by the profile. In one or more embodiments of the invention, a separate profile may exist for different portions of the capacitance input device. For example, an individual (i.e., separate or distinct) profile may exist for an x-axis of the input device and an individual profile may exist for a y-axis of the input device.

In one or more embodiments of the invention, a predetermined timeframe corresponds to a unit of time having a start and an end that is defined prior to the start of the predetermined timeframe. In one or more embodiments of the invention, the predetermined timeframe may be the time to obtain a single measured data value from each electrode of the capacitance input device or portion of capacitance input device. In such a scenario, the timeframe may be the time to acquire data for a single profile. The predetermined timeframe may be a snapshot in time or a length of time used to obtain the single measured data value from each sensor electrode represented in the profile.

Turning now to the figures, FIG. 1A is a block diagram of an exemplary input device (100), in accordance with embodiments of the invention. The input device (100) may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device (100) and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device (100) can be implemented as a physical part of the electronic system, or can be physically separate from the electronic system. As appropriate, the input device (100) may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1A, the input device (100) is shown as a proximity sensor device (also often referred to as a "touchpad" or a "touch sensor device") configured to sense input provided by one or more input objects (140) in a sensing region (120). Example input objects include fingers and styli, as shown in FIG. 1A.

Sensing region (120) encompasses any space above, around, in and/or near the input device (100) in which the input device (100) is able to detect user input (e.g., user input provided by one or more input objects (140)). The sizes, shapes, and locations of particular sensing regions may vary widely from embodiment to embodiment. In some embodiments, the sensing region (120) may have a rectangular shape when projected onto an input surface of the input device (100).

FIG. 1B shows an example sensing region (120) of an input device (100) in one or more embodiments of the invention. As shown in FIG. 1B, in some embodiments, the sensing region (120) extends from a surface of the input device (100) in one or more directions into space until signal-to-noise ratios prevent sufficiently accurate object detection. The distance to which this sensing region (120) extends in a particular direction, in various embodiments, may be on the order of less than a millimeter, millimeters, centimeters, or more, and may vary significantly with the type of sensing technology used and the accuracy desired. In such embodiments, the sensing region may include a surface sensing region (150) and an above surface sensing region (160).

In many embodiments, the surface sensing region (150) corresponds to a portion of the sensing region that has contact with an input surface (e.g. a touch surface) of the input device (100) and/or contact with an input surface of the input device (100) coupled with some amount of applied force or pressure. Here, the contact corresponds to a physical touching between the input object and the input surface. In various embodiments, input surfaces may be provided by surfaces of casings within which the sensor electrodes reside, by face sheets applied over the sensor electrodes or any casings, etc. In such a scenario, the contact with the input surface may correspond to contact with the surfaces of casings, face sheets or any other housing of the sensor electrodes.

In contrast, in many embodiments, the above surface sensing region (160) corresponds to a portion of the sensing region that does not involve contact with the input surface. In other words, the above surface sensing region (160) does not include a portion of the sensing region that physically touches or is physically connected to the input device. The above surface sensing region (160) is distinct from and does not overlap with the surface sensing region. Further, although the terms surface and above surface are used herein, the above surface sensing region may be angularly offset from the surface sensing region. In other words, the above surface sensing region may include any area that is capable of being measured by the sensing electrodes and that is distinct from and non-overlapping with the surface sensing region. For example, the above surface sensing region may include areas that are next to the input device (100) and do not touch the input surface. In various embodiments, the surface sensing region 150 may further correspond to a portion of the sensing region that is proximate with the input surface of the input device, where the portion of the sensing region that is proximate the input surface is not comprised within the above surface sensing region. In many embodiments, the surface sensing region corresponds to a first portion of the sensing region and the above the surface sensing region corresponds to a second portion of the sensing region, where the first portion of the sensing region is between the surface of the input device and the second portion of the sensing region. Further, in one embodiment, the sensing surface region and the above sensing region are configurable parameters, such that portions of the sensing region that is comprised within in each is a configurable parameter.

Returning to FIG. 1A, the input device (100) may utilize any combination of sensor components and sensing technologies to detect user input in the sensing region (120). The input device (100) comprises one or more sensing elements for detecting user input. As several non-limiting examples, the input device (100) may use capacitive, elastive, resistive, inductive, magnetic, acoustic, ultrasonic, and/or optical techniques. In one or more embodiments of the invention, the input device (100) is a capacitance sensing input device. In such embodiments, the sensing electrodes may include functionality to use capacitive techniques alone or in combination with other sensing techniques.

Some implementations are configured to provide images that span one, two, three, or higher dimensional spaces. Some implementations are configured to provide projections of input along particular axes or planes.

In some inductive implementations of the input device (100), one or more sensing elements pick up loop currents induced by a resonating coil or pair of coils. Some combination of the magnitude, phase, and frequency of the currents may then be used to determine positional information.

In some capacitive implementations of the input device (100), voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes") and one or more receiver sensor electrodes (also "receiver electrodes"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive. In one or more embodiments, a resulting signal may be referred to as a sensing signal.

Some capacitive implementations utilize both transcapacitance and absolute capacitance sensing methods. In other words, some capacitive implementations are a hybrid of transcapacitance and absolute capacitance sensing methods based on changes in the capacitive coupling between sensor electrodes and between sensor electrodes and an input object.

Capacitive images can be adjusted for the background capacitance of the sensor device for more efficient processing. Some embodiments accomplish this by "baselining" measurements of the change in capacitance to produce a "baselined capacitive frame", "delta profile", a "delta measurement" or a "delta frame." That is, some embodiments compare the measurements forming a sensor frame with appropriate "baseline values" of a "baseline frame" and determine changes from that baseline image. In various embodiments, the sensor frame may comprise one or more profiles (or similar representation of measured data) or a capacitive image.

In FIG. 1A, a processing system (110) is shown as part of the input device (100). The processing system (110) is configured to operate the hardware of the input device (100) to detect input in the sensing region (120). The processing system (110) comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). The processing system (110) may include all, part, or none of the sensor.

In some embodiments, the processing system (110) also comprises electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to sensing element(s) of input device (100), and one or more components elsewhere. For example, the input device (100) may be a peripheral coupled to a desktop computer, and the processing system (110) may comprise software configured to run on a central processing unit of the desktop computer and one or more ICs (perhaps with associated firmware) separate from the central processing unit. As another example, the input device (100) may be physically integrated in a phone, and the processing system (110) may comprise circuits and firmware that are part of a main processor of the phone. In some embodiments, the processing system (110) is dedicated to implementing the input device (100). In other embodiments, the processing system (110) also performs other functions, such as operating display screens, driving haptic actuators, etc.

The processing system (110) may be implemented as a set of modules that handle different functions of the processing system (110). Each module may comprise circuitry that is a part of the processing system (110), firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In one or more embodiments of the invention, the processing system (110) includes a determination module (not shown). The determination module may correspond to hardware, software, firmware, or a combination thereof. In one or more embodiments of the invention, the determination module includes functionality to calculate a signal to noise ratio (SNR). An SNR is an estimate of the amount of data signal as compared to noise signal in a profile. In one or more embodiments of the invention, a data signal is the amount of a signal or size of the measured data value(s) that are attributable to an input object in the sensing region. In one or more embodiments of the invention, a noise signal is the amount of a signal or size of the measured data value(s) that are attributable to noise in the sensing region. The determination module may further include functionality to perform one or more steps of FIGS. 2-6.

In some embodiments, the processing system (110) responds to user input (or lack of user input) in the sensing region (120) directly by causing one or more actions. Example actions include changing operation modes, as well as GUI actions such as cursor movement, selection, menu navigation, and other functions. In some embodiments, the processing system (110) provides information about the input (or lack of input) to some part of the electronic system (e.g. to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

For example, in some embodiments, the processing system (110) operates the sensing element(s) of the input device (100) to produce electrical signals indicative of input (or lack of input) in the sensing region (120). The processing system (110) may perform any appropriate amount of processing on the electrical signals in producing the information provided to the electronic system. For example, the processing system (110) may digitize analog electrical signals obtained from the sensor electrodes. As another example, the processing system (110) may perform filtering or other signal conditioning. As yet another example, the processing system (110) may subtract or otherwise account for a baseline, such that the information reflects a difference between the electrical signals and the baseline. As yet further examples, the processing system (110) may determine positional information, recognize inputs as commands, recognize handwriting, and the like.

"Positional information" as used herein broadly encompasses absolute position, relative position, velocity, acceleration, and other types of spatial information. For example, positional information may include height of the input object(s) above the sensing surface, a position, an amount of jitter, and/or other information about the position of the input object(s). A height may be an absolute height or a height as measured on a scale (e.g., a relative height). The position may include an x-coordinate identifier and a y-coordinate identifier of the input object, or another technique for reporting position. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device (100) is implemented with additional input components that are operated by the processing system (110) or by some other processing system. These additional input components may provide redundant functionality for input in the sensing region (120), or some other functionality. FIG. 1A shows buttons (130) near the sensing region (120) that can be used to facilitate selection of items using the input device (100). Other types of additional input components include sliders, balls, wheels, switches, and the like. Conversely, in some embodiments, the input device (100) may be implemented with no other input components.

In some embodiments, the input device (100) comprises a touch screen interface, and the sensing region (120) overlaps at least part of an active area of a display screen. For example, the input device (100) may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device (100) and the display screen may share physical elements. For example, some embodiments may utilize some of the same electrical components for displaying and sensing. As another example, the display screen may be operated in part or in total by the processing system (110).

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

FIGS. 2-6 show flowcharts in one or more embodiments of the invention. While the various steps in these flowcharts are presented and described sequentially, some or all of the steps may be executed in different orders, may be combined or omitted, and some or all of the steps may be executed in parallel. Furthermore, the steps may be performed actively or passively. For example, some steps may be performed using polling or be interrupt driven in accordance with one or more embodiments of the invention. By way of an example, determination steps may not require a processor to process an instruction unless an interrupt is received to signify that condition exists in accordance with one or more embodiments of the invention. As another example, determination steps may be performed by performing a test, such as checking a data value to test whether the value is consistent with the tested condition in accordance with one or more embodiments of the invention.

Figure 2:
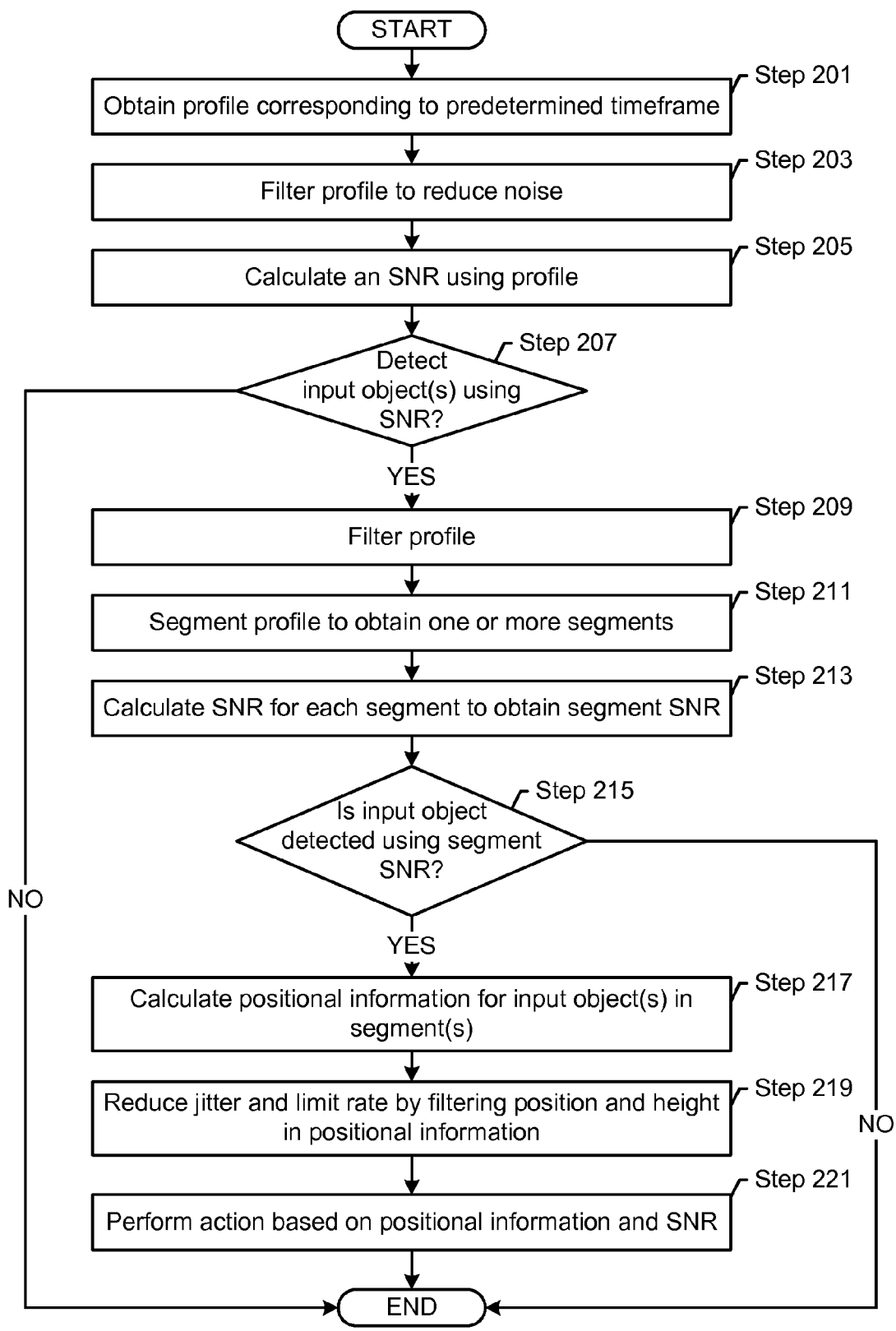
FIGS. 2-6 show flowcharts in one or more embodiments of the invention.

FIG. 2 shows a flowchart for using an SNR to detect input object(s) in the sensing region in one or more embodiments of the invention. In Step 201, a profile corresponding to a predetermined timeframe is obtained. Obtaining a profile may include determining a measured data value corresponding to a resulting signal (or sensing signal) received with each sensor electrode. The resulting signals (or sensing signals) may be received at once or over a span of time. For example, the sensor electrodes may receive the resulting signals at one time and output the corresponding measured data values at one time. By way of another example, the sensor electrodes may receive resulting signals and output corresponding data row by row or column by column. Once the measured data values are determined, the measured data values may be grouped into the profile. Preprocessing may or may not be performed on the measured data values or on the profile before the profile is obtained in one or more embodiments of the invention.

The term "profile" is used herein in the general sense and in various embodiments while a profile may be shown and discussed as corresponding to an analog representation of data, this is not intended to be limiting, and they may also be discrete values. Further, a profile may also be alternatively referred to as a projection or a combined measurement.

In Step 203, the profile is filtered to reduce noise. For example, in one or more embodiments of the invention, the profile may be temporally filtered, spatially filtered, or a combination thereof. Specifically, temporally filtering the profile includes filtering based on previous profiles. Such removal of noise may include adjusting the profile based on a current identified baseline. A baseline is an expected profile when no data signal exists. The baseline may account for interference resulting from other objects in the sensing region, temperature changes, and/or other environmental effects. In one embodiment, spatially filtering the profile includes spatial averaging across the spatial dimension of the profile.

In Step 205, the SNR is calculated using the profile in one or more embodiments of the invention. In one or more embodiments of the invention, the SNR is calculated using the temporally and/or spatially filtered profile from Step 201. Calculating the SNR may be performed as discussed below and in FIG. 4.

Continuing with FIG. 2, in Step 207, a determination is made whether one or more input objects are detected using the SNR in one or more embodiments of the invention. In particular, a determination is made whether the SNR satisfies a detection threshold. An SNR may be determined to satisfy a detection threshold, for example, when the value of the SNR is greater than the detection threshold. The detection threshold may vary temporally.

An SNR may also be determined to satisfy a detection threshold when the value of the SNR is at least the value of the detection threshold.

If no input object is detected in Step 207, then the method may proceed to end. Specifically, the result of analyzing the profile may be that no input object is detected for the current timeframe. In such a scenario, no actions are performed with respect to any input object in one or more embodiments of the invention. Alternatively, the action may be to report that nothing is detected. In one or more embodiments of the invention, when no input object is detected, various values may be updated. For example, the noise statistic and/or baseline may be updated when no objected is detected in the sensing region.

If an input object is detected, the flow may proceed to Step 209. In Step 209, the profile is filtered. In one or more embodiments of the invention, the filtering of the profile in Step 209 is spatial filtering. Spatial filtering may include padding the profile to obtain a padded profile, calculating a filtered padded profile, extracting the filtered profile, and interpolating the profile. Padding the profile may include adding padded values to the set of measured data values, whereby the padded values are added adjacent to edges of the measured data values (i.e., the padded values become neighbors of measured data values missing at least one neighbor). The padded values may be, for example, zero. Other padded values may be used without departing from the scope of the claims.

Calculating the filtered padded profile may include convolving the padded profile with a filter template. The filtered profile is extracted to remove the padded values from the filtered padded profile. Further, the filtered profile is interpolated for templates having an even number of elements. In one or more embodiments of the invention, a filter template is selected from a set of filter templates. The filter template is applied to the profile.

Continuing with FIG. 2, in Step 211, the profile is segmented to obtain a segmented profile having one or more segments. The segmenting includes partitioning the profile to represent individual contiguous regions, that each may have an input object. The partitioning is based on the measured data values with respect to surrounding measured data values.

For example, consider the scenario in which two input objects are in the sensing region, and an input object produces one or more high measured data values from a sensing electrode. In the example, because two input objects are in the sensing region, the measured data values include two regionally maximum values, each corresponding to an input object, separated in the ordered set by at least one smaller value (i.e., a local minimum). The segmenting of the profile partitions may be based on the ordered set of the profile, such that the two regionally maximum values of the profile are in individual segments.

In Step 213, the SNR is calculated for each segment of the segmented profile. Calculating the SNR for each segment may be performed as discussed below and shown in FIG. 4 with the following modification. Rather than using the entire profile for the SNR calculation, only the portion of the profile corresponding to the segment is used for the calculation. The steps of FIG. 4 may repeat for each segment.

Continuing with FIG. 2, in Step 215, a determination is made whether an object is detected using the segment SNR. Specifically, a determination is made whether one or more of the segment SNR(s) satisfies the detection threshold. Determining whether a segment SNR satisfies the detection threshold may be performed similar to determining whether an SNR satisfies the detection threshold as discussed above and in Step 207.

If none of the segment SNR(s) satisfy the detection thresholds, then the method may proceed to end. Specifically, the result of analyzing the profile may be that no input object is detected for the current timeframe. In such a scenario, no actions are performed in one or more embodiments of the invention. Alternatively, the action may be to report that nothing is detected.

If an input object is detected for at least one segment using the segment SNR corresponding to the segment, then the flow may proceed to Step 217 for each segment of the profile in which an input object is detected. In Step 217, positional information for input object(s) in the segments is calculated. In one or more embodiments of the invention, the positional information is calculated individually for each segment. Calculating the positional information may include calculating a position of the input object along an axis or projected on the input surface and calculating a height of the input object. For example, the position may be interpolated using the positions surrounding the position of the sensor electrode producing a maximum value in the filtered profile for the segment (i.e., a local maximum). Alternatively, in various embodiments, the local minimum or other identifier may indicate the position.

In one or more embodiments of the invention, calculating positional information may include calculating a height of the input object. Specifically, the input object may be in the surface sensing region or an above surface sensing region. The height may be estimated based on SNR. In particular, the SNR is inversely proportional to the height of the input object in one or more embodiments of the invention. Thus, the higher the input object is above the input surface, the lower the value of the SNR. In other words, the farther away a detected input object is from the sensing electrodes (e.g., by height), more noise signal exists in relation to data signal. Alternatively or additionally, the height may be estimated based on the size of the data value in the profile at the position. As discussed, the height may be an absolute height, such as presented in millimeters, centimeters, etc., or a relative height. For example, a relative height may be based on a scale of zero to two hundred fifty five with zero being on or within one millimeter of the input surface.

In Step 219, jitter is reduced and a rate is limited by filtering position and height in positional information for each segment having an input object to obtain filtered positional information for the segment. Jitter is quick unintentional movement of the input object over the sensing region. Jitter may be reduced and the rate may be limited using a temporal low pass filter.

In Step 221, an action is performed based on the calculated positional information and the SNR. The action may be to report the filtered positional information, such as to the host or a component of the host. In such a scenario, the host may perform one or more actions based on the positional information and SNR. The action may be to change the display of a graphical user interface (GUI), such a show that a cursor or pointer has move, show certain GUI component highlighted, perform an action defined by GUI component corresponding to the position (e.g., transition to another screen, make a phone call, or perform another GUI component defined action), or perform another action. The SNR may be used as an estimate of certainty in the positional information and input object to determine whether to perform the action.

Although FIG. 2 shows analyzing a single profile, the steps of FIG. 2 may repeat for each timeframe. Specifically, FIG. 2 may be continually performed over multiple timeframes.

Figure 3:
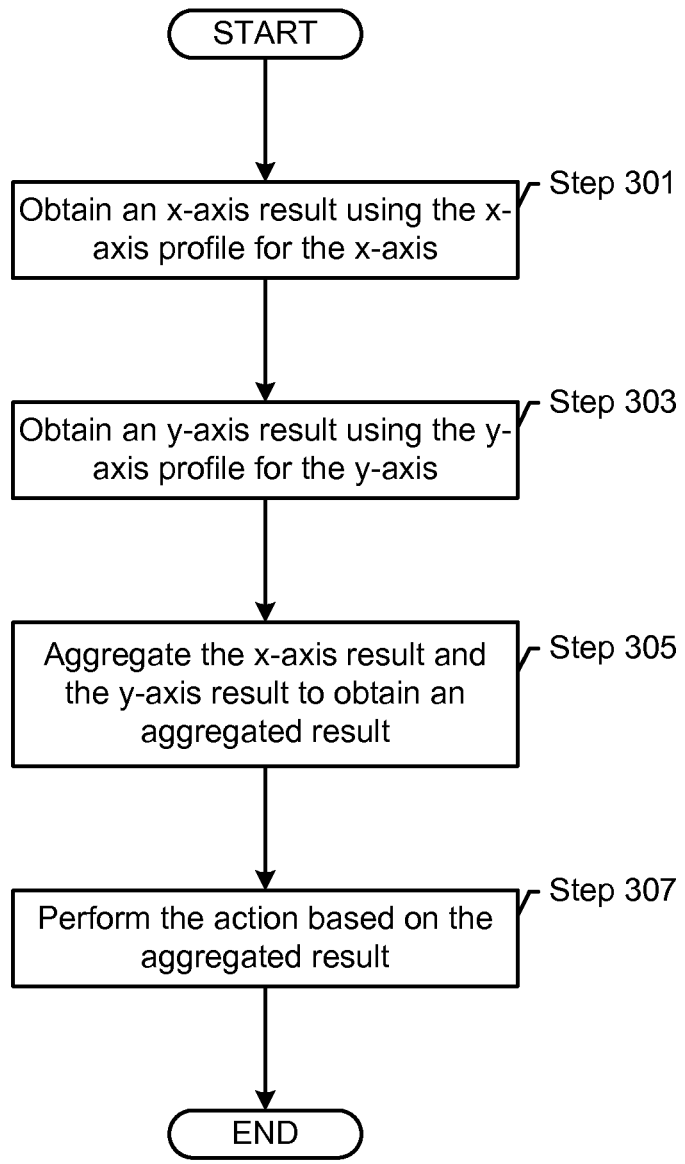

FIG. 3 shows a flowchart for aggregating results from multiple profiles where each profile corresponds to a different axis. In Step 301, an x-axis result is obtained using the x-axis profile for the x-axis. Specifically, FIG. 2 may be performed for a profile from the x-axis for a particular timeframe. In one or more embodiments of the invention, the action in Step 221 of FIG. 2 may be replaced with the action in Step 307 of FIG. 3 (described below) or may be to report the positional information to a module that performs the Steps of FIG. 3. The result may be whether one or more input objects are detected along the x-axis, and, if detected, positional information for the x-axis for each input object.

In Step 303, a y-axis result is obtained using the y-axis profile for the y-axis. Specifically, for the same timeframe as used in Step 301, a y-axis profile is obtained and analyzed using the steps of FIG. 2 in one or more embodiments of the invention. The result may be whether one or more input objects are detected along the y-axis, and, if detected, positional information for the y-axis for each input object.

In Step 305, the x-axis result and the y-axis result is aggregated to obtain an aggregated result. By way of an example and not to limit the scope of the claims, the following Table 1 provides an example of how the positional information of the results may be aggregated. In Table 1, X1 and X2 are each positions along the x-axis, Y1 and Y2 are each positions along the y-axis. Further, the use of "[" and "]" indicates an ordered set, whereby the aggregated position for each input object may be by taking the same or alternate ordered element from each ordered set.

TABLE 1

| Profile X Position(s) | Profile Y Position(s) | Reported Position(s) |
|---|---|---|
| None | None | None |
| $X_1$ | None | None |
| None | $Y_1$ | None |
| $X_1$ | $Y_1$ | $X_1, Y_1$ |
| $X_1, X_2$ | $Y_1$ | $[X_1, X_2], [Y_1, Y_1]$ |
| $X_1$ | $Y_1, Y_2$ | $[X_1, X_1], [Y_1, Y_2]$ |
| $X_1, X_2$ | $Y_1, Y_2$ | $[X_1, X_2], [Y_1, Y_2]$ |

Additionally, in one or more embodiments of the invention, the SNR and/or the common mode (CM) offsets from each axis may be used to determine whether to inhibit performing the action, such as reporting, based on the positional information. By way of an example and not to limit the scope of the claims, the following Table 2 provides an example of how the SNR of the results may be aggregated. In Table 2, low and high refer to whether the SNR and CM offsets are above or below a defined SNR threshold and defined CM threshold, respectively, and don't care means that the value of the CM offset is irrelevant.

TABLE 2

| Profile X SNR/CM offset | Profile Y SNR/CM offset | Inhibit Action |
|---|---|---|
| Low/Low | Low/Low | No |
| Low/High | Low/High | Yes |
| Low/Don't care | High/Don't care | Yes |
| High/Don't care | Low/Don't care | Yes |
| High/Don't care | High/Don't care | No |

In Step 307, an action is performed based on the aggregated result. The action may be performed in a similar manner discussed above with reference to Step 221 of FIG. 2 using the aggregated result.

Figure 4:
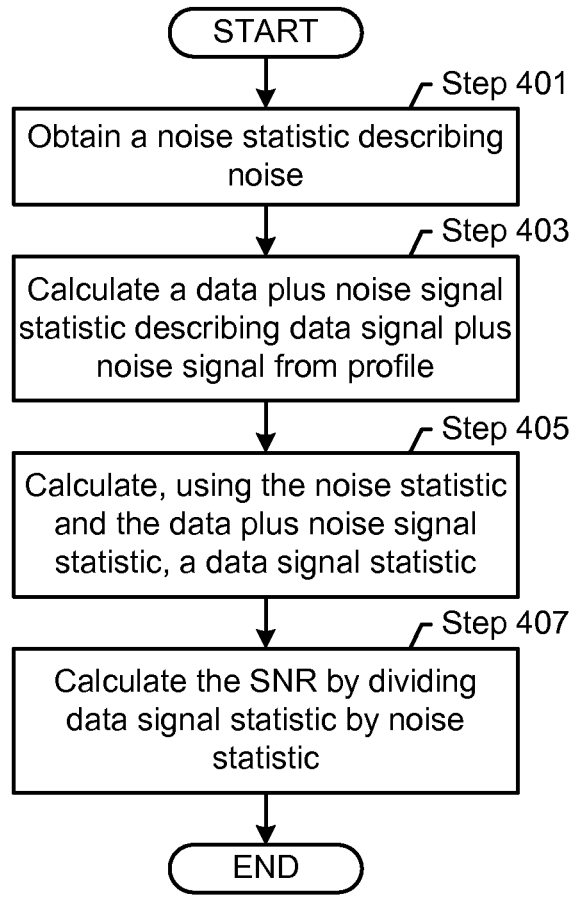

FIG. 4 shows a flowchart for calculating an SNR in one or more embodiments of the invention. The profile referenced below and in FIG. 4 may be the original profile, a filtered profile, a segment of the profile, a filtered profile segment, etc. In Step 401, a noise statistic describing the noise is obtained. The noise statistic is any measure describing an attribute of noise for the profile. For example, the noise statistic may be standard deviation, variance, or any other measure or combination thereof. Obtaining the noise statistic is discussed below and in FIG. 5.

Continuing with FIG. 4, in Step 403, a data plus noise signal statistic is calculated from the profile. In one or more embodiments of the invention, calculating data plus noise signal statistic is performed by calculating the statistic across the entire profile. In one or more embodiments of the invention, the statistic calculated in Step 401 is the same type of statistic calculated in Step 403. For example, if variance is used in Step 401, then variance is calculated in Step 403.

In Step 405, using the noise statistic and the data plus noise signal statistic, a data signal statistic is calculated. In one or more embodiments of the invention, the data signal is assumed independent of the noise signal. In such embodiments, calculating the data signal statistic may be performed by subtracting the noise statistic from the data plus noise signal statistic. If a dependency is assumed, then other statistical techniques may be used to calculate the data statistic.

In Step 407, the SNR is calculated by dividing the data signal statistic by the noise statistic.

Figure 5A:
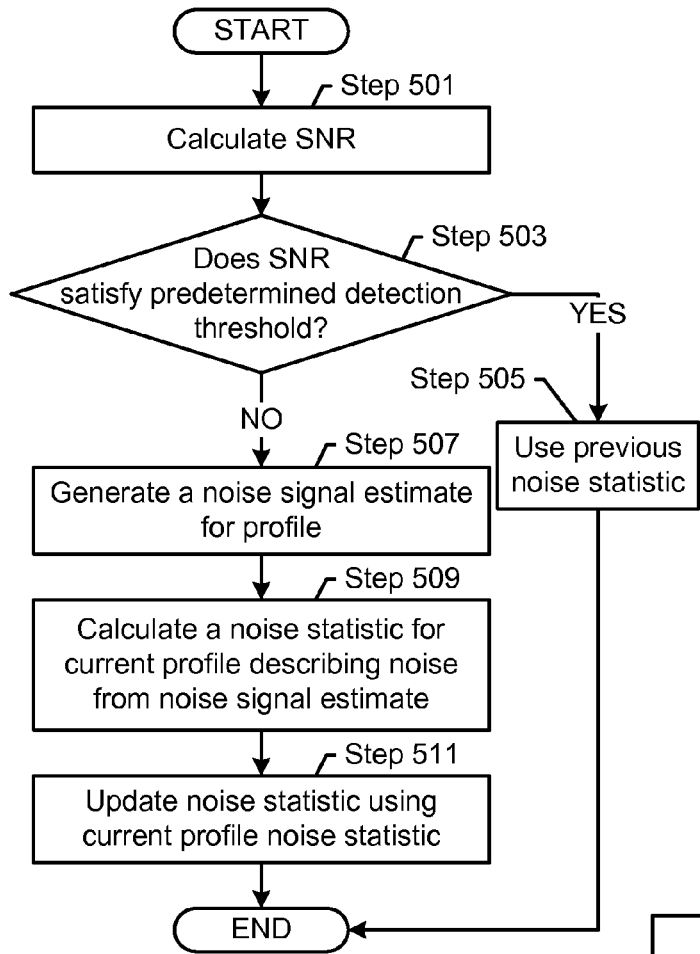

FIG. 5A shows a flowchart for calculating a noise statistic in one or more embodiments of the invention. In one or more embodiments of the invention, the noise statistic is estimated based on previous profiles. In other words, a timeframe lag exists between when the noise statistic is calculated and when the noise statistic is used. Thus, the noise statistic calculated in FIG. 5A is used for a subsequent profile in the relation to the profile used to calculate the noise statistic.

In Step 501, the SNR is calculated. Calculating the SNR may be performed as discussed above and in FIG. 4. In Step 503, a determination is made whether the SNR satisfies the predetermined detection threshold. Determining whether the SNR satisfies the predetermined detection threshold may be performed as discussed above and in Step 207 of FIG. 2.

Continuing with FIG. 5A, if the SNR satisfies the predetermined detection threshold, then the previous noise statistic is used. Specifically, if the SNR satisfies the predetermined detection threshold, then data signal is determined to exist in the profile. In such a scenario, the flowchart of FIG. 5A may set the previously calculated noise statistic as the current noise statistic in Step 505.

In Step 507, if the SNR does not satisfy the predetermined detection threshold, then a noise signal estimate is generated for the profile. In one or more embodiments of the invention, the noise signal estimate includes a data value for each sensor electrode represented in the profile. In one or more embodiments, calculating the noise estimate includes removing noise attributable to a sensor electrode already accounted for by the sensor electrode's neighboring sensor electrode.

In Step 509, the noise statistic is calculated for the current profile. Calculating the noise statistic is performed based on the type of statistic. For example, if the noise statistic is variance, calculating noise statistic may be performed using techniques for calculating variance from a set of data values corresponding to the noise estimate.

In Step 511, the noise statistic is updated using the current profile noise statistic. In one or more embodiments of the invention, the noise statistic is temporally averaged. Thus, updating the noise statistic includes updating the temporal average of the noise statistic from past profiles with the noise statistic for the current profile. The updated noise statistic may be used as the current noise statistic. As discussed above, the current noise statistic is used in calculating SNR.

Figure 5B:
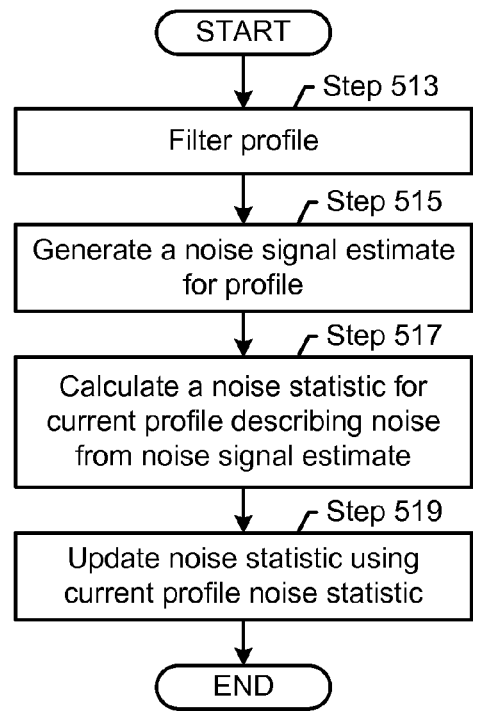

Turning now to the flowchart of FIG. 5B, in Step 513, the profile is filtered. In one or more embodiments, the profile is temporally and/or spatially filtered. The profile may be temporally and spatially filtered using various known filtering techniques. In Step 515, a noise signal estimate from the profile is generated. In one or more embodiments of the invention, the noise signal estimate includes a data value for each sensor electrode represented in the profile. In one or more embodiments, calculating the noise estimate includes removing noise attributable to a sensor electrode already accounted for by the sensor electrode's neighboring sensor electrode.

In Step 517, the noise statistic is calculated for the current profile. Calculating the noise statistic is performed based on the type of statistic. For example, if the noise statistic is variance, calculating noise statistic may be performed using techniques for calculating variance from a set of data values corresponding to the noise estimate.

In Step 519, the noise statistic is updated using the current profile noise statistic. In one or more embodiments of the invention, the noise statistic is temporally averaged. Thus, updating the noise statistic includes updating the temporal average of the noise statistic from past profiles using the noise statistic for the current profile. The updated noise statistic may be used as the current noise statistic. As discussed above, the current noise statistic is used in calculating SNR.

The following sets of equations are example equations for calculating SNR when the statistic is variance. The following provides an example only and is not intended to limit the scope of the claims. Other techniques and equations may be used. Further, the following equations use various variables. Table 3 below provides a description of each variable that are used in the equations.

TABLE 3

| Variable | Description |
| --- | --- |
| D | Delta profile (i.e., the profile once the baseline is removed) |
| n | The number of positions as defined by number of sensor electrodes that capture measured data values for the profile |
| i | An iterator for iterating over the number of positions |
| j | An iterator for iterating over successive profiles |
| k | A specific timeframe |
| m | Number of successive profiles for noise calculation |
| $D_k^{noise}(i)$ | Profile noise estimate at timeframe k and position i |
| $V_k^{noise}(i)$ | Variance of noise at timeframe k and position i |
| $aveV_k^{noise}$ | Average of variance of noise for timeframe k |
| $D_k^{detrended}(i)$ | De-trended profile at timeframe k and position i |
| $D_k^{detrended}$ | De-trended profile at timeframe k |
| $mean(D_k)$ | Mean of the delta profile |
| $D_k^{ave}$ | De-trended profile averaged over successive profiles ending at timeframe k |
| $V_k^{aveprofile}$ | Spatial variance of the de-trended profile averaged over successive profiles ending at timeframe k |
| $V_k^{profile}$ | Instantaneous spatial variance of the de-trended profile at timeframe k |
| $aveV_k^{profile}$ | Average instantaneous spatial variance of the de-trended profile at timeframe k over the prior p-1 timeframes |
| $x_k$ | Low pass filter state (the filtered position or Z estimate) |
| a | Low pass filter discrete eigenvalue. In one or more embodiments of the invention, this value is limited to be in the range of [0, 1] and 1-a is proportional to (snr-threshold)/threshold |
| $u_k$ | The unfiltered position or Z value input to the low pass filter |

In the following example equations, consider the scenario in which a filtered delta profile $D_k$ of dimension 1×n exists at timeframe k. Further, in the equations, variance is used as the noise statistic, data plus noise signal statistic, and data statistic for the SNR calculations.

The noise variance may be calculated by applying a spatial first difference to the filtered delta profile to estimate the profile noise, and calculating and recursively averaging over successive profiles the noise spatial variance when the profile SNR is small, such as ten percent of the SNR threshold level. In one or more embodiments of the invention, the averaging may improve the noise variance estimate.

The profile noise signal estimate ($D_k^{noise}$) may be calculated using equation (Eq.) 1:

$$D_k^{noise}(i) = D_k(i+1) - D_k(i), \text{ for } i=1{:}n-1 \qquad \text{Eq. 1}$$

The instantaneous noise spatial variance ($V_k^{noise}$) at timeframe k may be calculated using equation 2:

$$V_k^{noise} = (D_k^i (D_k^i)^t)/(n-1) \qquad \text{Eq. 2}$$

The noise spatial variance averaged over m successive profiles ending at timeframe k ($aveV_k^{noise}$) may be calculated using Eq. 3:

$$aveV_k^{noise} = aveV_{k-1}^{noise} + (V_k^{noise} - aveV_{k-1}^{noise})/m \text{ for } k>1 \qquad \text{Eq. 3}$$

Using the above calculations, the signal-plus-noise spatial variance may be calculated by de-trending the filtered delta profile of the filtered delta profile's mean, calculating the profile spatial variances of the instantaneous de-trended profile and the average de-trended profile. The averaging window may be specified at initialization. In the example, the SNR calculation uses the instantaneous profile spatial variance if instantaneous profile spatial variance value is small, such as less than ten percent of its average over the prior time points in the averaging window, to avoid a temporal lag when a hovering object departs. Otherwise, the SNR calculation may use the average profile spatial variance.

The de-trended profile ($D_k^{detrended}$) may be calculated using equation 4:

$$D_k^{detrended}(i) = D_k(i) - \text{mean}(D_k), \text{ for } i=1:i \qquad \text{Eq. 4}$$

The de-trended profile averaged over p successive profiles ending at timeframe k ($D_k^{ave}$) may be calculated using Eq. 5:

$$D_k^{ave} = \left(\sum_{j=0}^{p-1} D_{k-j}^{detrended}\right)/p \qquad \text{Eq. 5}$$

The spatial variance of the de-trended profile averaged over p successive profiles ending at timeframe k ($V_k^{aveprofile}$) may be calculated using Eq. 6:

$$V_k^{aveprofile} = (D_k^{ave} i (D_k^{ave})^i)/n \qquad \text{Eq. 6}$$

The instantaneous profile spatial variance ($V_k^{profile}$) at timeframe k may be calculated using Eq. 7:

$$V_k^{profile} = (D_k^{detrended} i (D_k^{detrended})^i)/n \qquad \text{Eq. 7}$$

The instantaneous profile spatial variance average at timeframe k for the prior p−1 timeframes ($aveV_k^{profile}$) may be calculated using Eq. 8:

$$aveV_k^{profile} = \left(\sum_{j=1}^{p-1} V_{k-j}^{profile}\right)/(p-1) \qquad \text{Eq. 8}$$

Thus, the SNR may be calculated using Eq. 9

$$(V_k^{aveprofile} - aveV_k^{noise})/aveV_k^{noise}, \text{ if } V_k^{profile} > 0.1 = aveV_k^{profile}(V_k^{profile} - aveV_k^{noise})/aveV_k^{noise}, \text{ otherwise} \qquad \text{Eq. 9}$$

The profile may be segmented and segmented SNR may be calculated using the above equations for each segment. To perform profile segmentation, the local maxima and minima of the filtered delta profile may be calculated based on a minimum peak deviation initialized as a multiple (e.g., greater than six) of the noise estimate standard deviation ($\sigma_{noise}$).

Further, using the above, the position and height calculation (hereinafter referred to as Z) and jitter filtering may be calculated using the following technique. Position may be calculated using linear interpolation (e.g., three channel linear interpolation) in the example, which is common mode (CM) invariant. Other methods for calculating position may be used without departing from the scope of the invention. Z may be calculated as a function of SNR, which is CM invariant, and scaled to the range of [0-255], with 0 at the limiting height of detection and 255 within 1 mm of proximity. Z may be calculated to be proportional to height. Since SNR is a function of the hover height for a moderate sized finger, the SNR mapping may be inverted to provide a height estimate.

The position and Z estimates may be filtered to reduce positional jitter at low SNR using a non-linear low pass filter of the form shown in Eq. 10:

$$x_{k+1} = \alpha x_k + (1-\alpha)u_k \qquad \text{Eq. 10}$$

The above is only one set of example equations for calculating SNR, position and height using variance. Other equations and techniques may be used without departing from the scope of the invention. For example, the following presents an example set of equations for calculating SNR, position, and height using average absolute deviation (AAD). In the following example, various variables are used. Table 4 below provides a description of each variable.

TABLE 4

| Variable | Description |
| --- | --- |
| AAD | Average absolute deviation |
| D | Delta profile (i.e., the profile once the baseline is removed) |
| n | The number of positions as defined by number of sensor electrodes that capture measured data values for the profile |
| i | An iterator for iterating over the number of positions |
| j | An iterator for iterating over successive profiles |
| k | A specific timeframe |
| m | Number of successive profiles for noise calculation |
| $D_k^{noise}(i)$ | Profile noise estimate at timeframe k and position i |
| $AAD_k^{noise}(i)$ | AAD of noise at timeframe k and position i |
| $aveAAD_k^{noise}$ | Average of AAD of noise for timeframe k |
| $D_k^{detrended}(i)$ | De-trended profile at timeframe k and position i |
| $D_k^{detrended}$ | De-trended profile at timeframe k |
| $\text{mean}(D_k)$ | Mean of the delta profile |
| $D_k^{ave}$ | De-trended profile averaged over successive profiles ending at timeframe k |
| $AAD_k^{aveprofile}$ | Spatial AAD of the de-trended profile averaged over successive profiles ending at timeframe k |
| $AAD_k^{profile}$ | Instantaneous spatial AAD of the de-trended profile at timeframe k |
| $aveAAD_k^{profile}$ | Average instantaneous spatial AAD of the de-trended profile at timeframe k over the prior p-1 timeframes |

In the following example equations, consider the scenario in which a filtered delta profile $D_k$ of dimension 1×n exists at timeframe k. Further, in the equations, AAD is used as the noise statistic, data plus noise signal statistic, and data statistic for the SNR calculations.

The noise AAD may be calculated by applying a spatial first difference to the filtered delta profile to estimate the profile noise, and calculating and recursively averaging over successive profiles the noise spatial AAD when the profile SNR is small, such as twenty five percent of the SNR threshold level. In one or more embodiments of the invention, the averaging improves the noise AAD estimate.

The profile noise signal estimate (may be calculated using Eq. 11:

$$D_k^{noise}(i) = D_k(i+1) - D_k(i), \text{ for } i=1:i-1 \qquad \text{Eq. 11}$$

The instantaneous noise spatial AAD ($AAD_k^{noise}$) at timeframe k may be calculated using Eq. 12:

$$AAD_k^{noise} = \text{sum}(|D_k^{noise}|)/n-1) \qquad \text{Eq. 12}$$

The noise spatial AAD averaged over m successive profiles ending at timeframe k ($aveV_k^{noise}$) may be calculated using Eq. 13:

$$aveAAD_k^{noise} = aveAAD_{k-1}^{noise} - aveAAD_{k-1}^{noise} - aveAAD_{k-1}^{noise})/m \text{ for } k>1 \qquad \text{Eq. 13}$$

The signal-plus-noise spatial AAD may be calculated by de-trending the filtered delta profile of its mean, and calculating the profile spatial AAD of the instantaneous de-trended profile of the current timeframe and the average de-trended profile. The averaging window may be specified at initialization. In the example, the SNR calculation may use the instantaneous profile spatial AAD if instantaneous profile spatial AAD value is small, such as less than ten percent of its average over the prior time points in the averaging window, to avoid a temporal lag when a hovering object departs. Otherwise, the SNR calculation may use the average profile spatial AAD.

The de-trended profile ($D_k^{detrended}$) may be calculated using Eq. 14:

$$D_k^{detrended}(i) = D_k(i) - \text{mean}(D_k), \text{ for } i=1 i \qquad \text{Eq. 14}$$

The de-trended profile averaged over p successive profiles ending at timeframe k ($D_k^{ave}$) may be calculated using Eq. 15:

$$D_k^{ave} = \left( \sum_{j=0}^{p-1} D_{k-j}^{detrended} \right) / p \qquad \text{Eq. 15}$$

Spatial AAD of the de-trended profile averaged over successive profiles ending at timeframe k ($AAD_k^{aveprofile}$) may be calculated using Eq. 16:

$$AAD_k^{aveprofile} = i(|D_k^{ave}|)/n \qquad \text{Eq. 16}$$

The instantaneous profile spatial AAD ($AAD_k^{profile}$) at timeframe k may be calculated using Eq. 17:

$$AAD_k^{profile} = \text{sum}(|D_k^{detrended}|)/n \qquad \text{Eq. 17}$$

The average instantaneous spatial AAD of the de-trended profile at timeframe k over the prior p−1 timeframes ($aveAAD_k^{profile}$) may be calculated using Eq. 18:

$$aveAAD_k^{profile} = \left( \sum_{j=1}^{p-1} AAD_{k-j}^{profile} \right) / (p-1) \qquad \text{Eq. 18}$$

The SNR may be calculated using Eq. 19:

$$(AAD_k^{aveprofile} - aveAAD_k^{noise})/aveAAD_k^{noise}, \text{ if} \\ AAD_k^{profile} > 0.1 i aveAAD_k^{profile} i (AAD_k^{profile} - \\ aveAAD_k^{noise})/aveAAD_k^{noise}, \text{ otherwise} \qquad \text{Eq.19}$$

In the above, the SNR is common mode noise invariant. Further, the position and height may be calculated using the techniques discussed above with respect to the first example set of equations. As discussed above, these sets of equations are only examples. Other equations and techniques may be used without departing from the scope of the invention.

Figure 6:
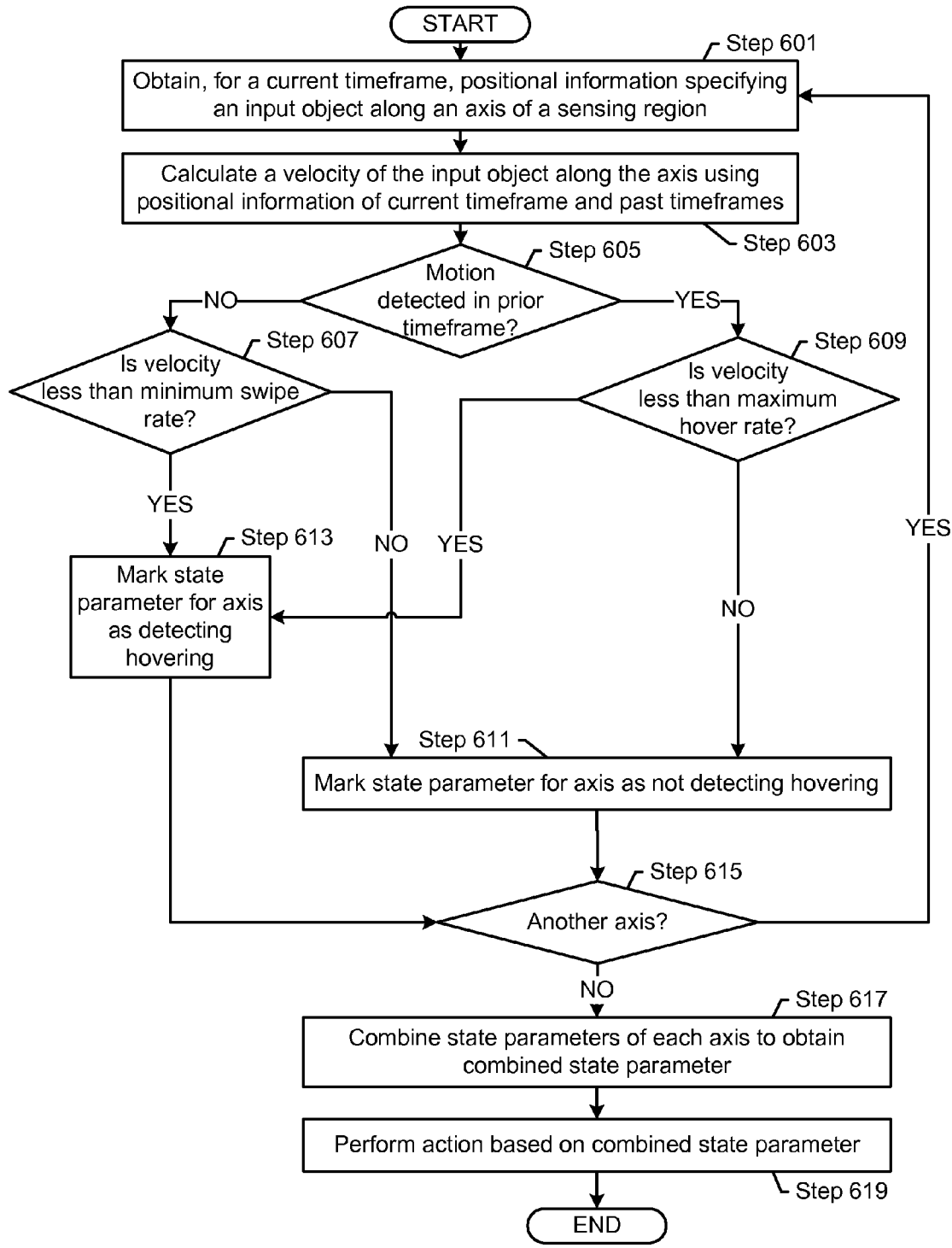

FIG. 6 shows a flowchart determining whether an input object is hovering or in the process of a swipe. A hovering input object is one in which the position of the input object in the sensing region is not intending to be changed rapidly. In other words, a user may be attempting to move to and sustain the input object in a fixed position with respect to the input surface. A hovering input object may change positional information with respect to height in one or more embodiments of the invention. A swipe is an intentional movement of the input object. For example, a swipe may be a part of a gesture. As used herein, any intentional movement of the input object with respect to the input surface may be considered a swipe. Thus, a swipe may encompass additional gestures besides single directional gestures. For FIG. 6 consider the scenario in which at least one input object is detected in the sensing region and the detection has occurred over at least two timeframes. Detecting the input object in the sensing region may be performed, for example, using SNR as discussed above and in FIG. 2. Other methods for detecting the input object may be used.

In Step 601, for a current timeframe, positional information specifying an input object along an axis of a sensing region is obtained. Obtaining the positional information may be performed as discussed above and in FIG. 2. Other methods for obtaining positional information may be used.

In Step 603, a velocity of the input object along the axis is calculated using positional information of current timeframe and past timeframes. Specifically, calculating the velocity includes identifying the amount of movement of the input object along the axis in relation to the amount of time elapsed between timeframes in which the input object is detected.

In Step 605, a determination is made whether object motion was detected in the prior timeframe. Specifically, a determination is made whether motion was detected in the timeframe before the current timeframe. If prior motion was not detected, in Step 607, a determination is made whether the current timeframe calculated velocity is less than a minimum swipe rate in one or more embodiments of the invention. The minimum swipe rate is the minimum velocity in which a swipe is assumed to occur. In one or more embodiments of the invention, the minimum swipe rate may be configurable and/or preset as a default.

If the velocity is less than a minimum swipe rate, then a state parameter for the axis is marked as detecting hover in Step 613. The state parameter for an axis specifies the current status (e.g., whether in swipe or hover) of the input object along the axis. Specifically, if the velocity of the input object is moving less than the minimum swipe rate along the axis, then the input object may be detected as being a hover rather than a swipe.

If the velocity is not less than a minimum swipe rate, then a state parameter for the axis is marked as not detecting hovering in Step 611. Specifically, if the velocity of the input object is not moving less than the minimum swipe rate along the axis, then the input object may not be detected as being a hover. In other words, the state parameter may be marked for detecting a swipe.

If prior frame object motion was detected in Step 605, in Step 609, a determination is made whether the current timeframe calculated velocity is less than a maximum hover rate. The maximum hover rate is the maximum velocity a hover input object may have. In one more embodiments, the maximum hover rate may be configurable and/or preset as a default.

If the velocity is less than a maximum rate, then a state parameter for the axis is marked as detecting hover in Step 613. If velocity is not less than a maximum rate then a state parameter for the axis is not marked as detecting hover. In other words, the state parameter may be marked for detecting a swipe.

In Step 615, a determination is made whether another axis to be analyzed exists for the current timeframe in one or more embodiments of the invention. If another axis exists, then the flow may proceed with the next axis.

In Step 617, if another axis does not exist, then the state parameter of each axis is combined to obtain a combined state parameter in one or more embodiments of the invention. For example, combining the state parameters may include setting the combined state parameter to swipe or not hovering if any one of the axis are set as swipe. Other rules or techniques may be used for combining state parameters may be used without departing from the scope of the claims.

In Step 619, an action is performed based on the combined state parameter. The action may be performed as discussed above in relation to Step 221 of FIG. 2.

Although FIG. 6 specifies that the determination steps use "less than" or "greater than", "less than or equal to" and/or "greater than or equal to", respectively, may be used without departing from the scope of the invention.

The following is an example. The following is for example purposes only and not intended to limit the scope of the claims. Consider the scenario in which Ted, a user, is using an address book on his smart phone with a touch screen display to call Scott. Ted also has Schmitt, Sanchez, Schubert, Scriber, and Seng in his address book along with several other names. Ted has large fingers and is jittery from drinking caffeinated coffee.

Continuing with the example, Ted scrolls through the address book by a quick single direction swipe downward approximately two centimeters above the sensing surface (i.e., in the above surface sensing region). For each timeframe, measured data corresponding to a resulting signal received with each sensor electrode in the smart phone is generated, representing a change in capacitance determined by the sensor electrodes, and the measured data values for the timeframe may be represented as a profile. Based on the profile, for each timeframe, an SNR is calculated for the profile and the Ted's finger is detected as being in the above surface sensing region. Ted's finger is detected despite the fact that the two centimeter distance to Ted's finger means that a large amount of noise exists in the signal from the sensor electrodes. Thus, for each timeframe, positional information is calculated and specifies the position of Ted's finger at the timeframe.

Continuing with the example, because the velocity of the Ted's finger in the y-axis is greater than the maximum hover rate over the course of the timeframes, the state parameter indicates that Ted's finger is swiping and, thus, the address book on Ted's smart phone appears to scroll to the "S" names. After address book scrolls to the "S" names, Ted realizes that Scott is displayed on the touch screen. Accordingly, Ted lets his finger hover over what he believes is the position for Scott. As discussed above, based on the SNRs calculated for the timeframes, Ted's finger is detected despite the large relative amount of noise caused by the height of Ted's finger. Because Ted is jittery from the coffee, Ted's finger is not perfectly still. Nevertheless, Ted's finger has a velocity of less than the minimum swipe rate and stays less than the maximum hover rate along all axis. Thus, a hover is detected. The action performed may be to highlight the name in which Ted is actually hovering over. In other words, a hovering input object in the above surface sensing region may be to highlight a GUI component that is being hovered over, whereas a stationary input object in the surface sensing region may be to select the GUI component. Because of Ted's large fingers, he learns that he is actually hovering over Scriber instead of Scott. Accordingly, Ted moves his finger upward to Scott and hovers over Scott. This time, the hover is detected as being over Scott and Scott is highlighted using the SNR and the velocity of Ted's finger. When Ted sees that Scott is highlighted, Ted taps on the sensing surface to select Scott and Scott is called.

Figure 7:
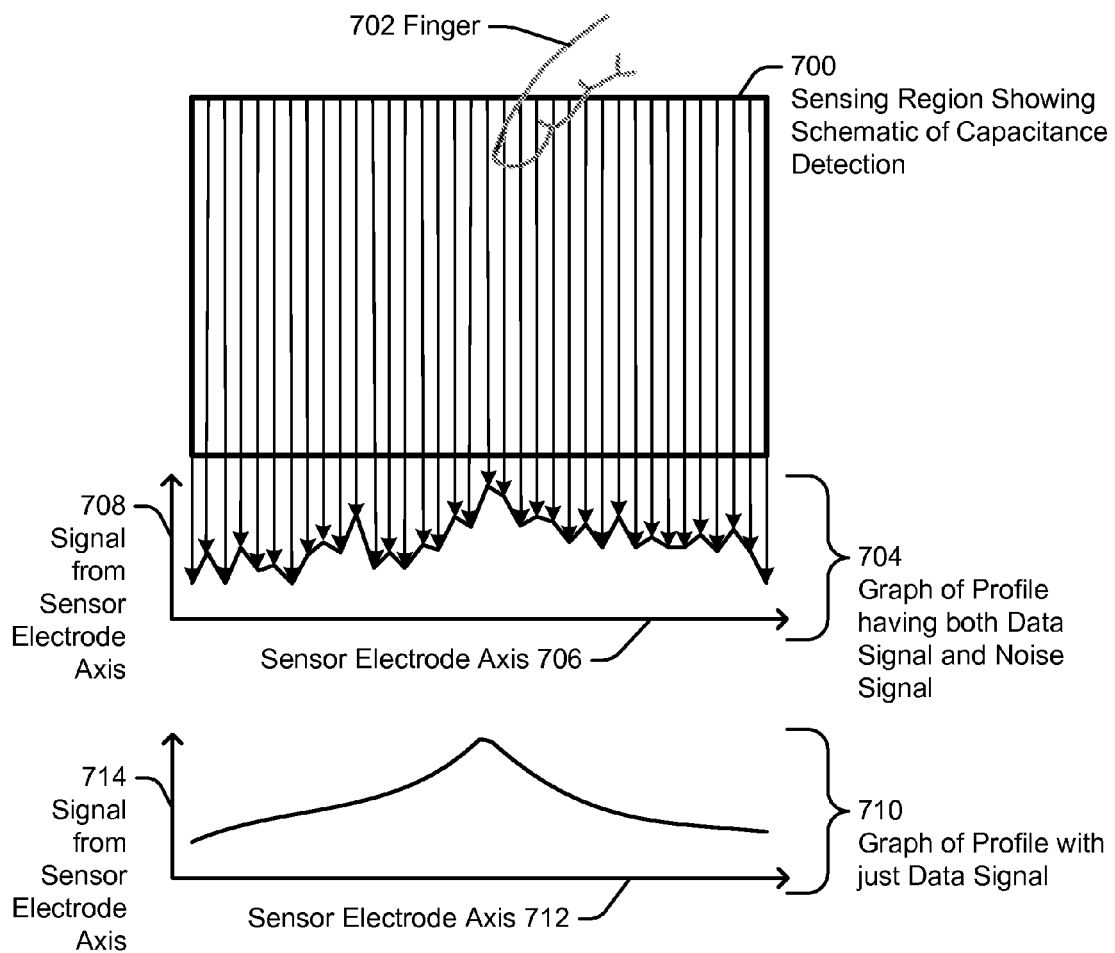
FIG. 7 shows an example in one or more embodiments of the invention.

FIG. 7 shows an example in one or more embodiments of the invention. The example discussed below is for example purposes only and not intended to limit the scope of the invention. FIG. 7 shows sensing region (700) showing a schematic of capacitance detection along the x-axis. Specifically, the sensing region (700) is shown as the box with the dark border. A finger (702) is an input object in the sensing region. Although not specifically shown in FIG. 7, consider the scenario in which the finger is in the above surface sensing region rather than physically touching the input surface.

In the example, measured data value may be generated corresponding to the resulting signals received with each of the thirty-six sensor electrodes along the x-axis, the measured data values representing the amount of capacitance detected across the entire column as shown by the lines on the sensing region (700). The number of sensor electrodes is only for example purposes. More or fewer sensor electrodes may exist without departing from the scope of the invention. The measured data values are graphed on the graph of the profile having both data signal and noise signal (704). Specifically, the x-axis of the graph (706) corresponds to the sensor electrode and the y-axis of the graph corresponds to value of the measured data value (i.e., the value of the signal from the sensor electrode) (708). Below the graph of the profile having both data signal and noise signal is a graph of a profile having just data signal (i.e., the noise portion of the signal is removed) (710). Similar to the graph (706), the x-axis of the graph (712) corresponds to the sensor electrode and the y-axis of the graph corresponds to value of the measured data value (i.e., the value of the signal from the sensor electrode) (714). In other words, graph (710) is a graph of an ideal profile having no noise. As shown in FIG. 7, the signal includes much noise as evident by the various peaks in the graph (704) as compared to graph (710) even though only one input object is in the sensing region. One or more embodiments of the invention are able to distinguish, for a particular timeframe, whether one or more input objects are actually in the sensing region or whether only noise exists based on the SNR for the particular timeframe. Further, in one or more embodiments of the invention, the profile may be filtered based on the SNR so that smoother data, such as that shown in graph (710) may be used to determine the positional information.

Figure 8:
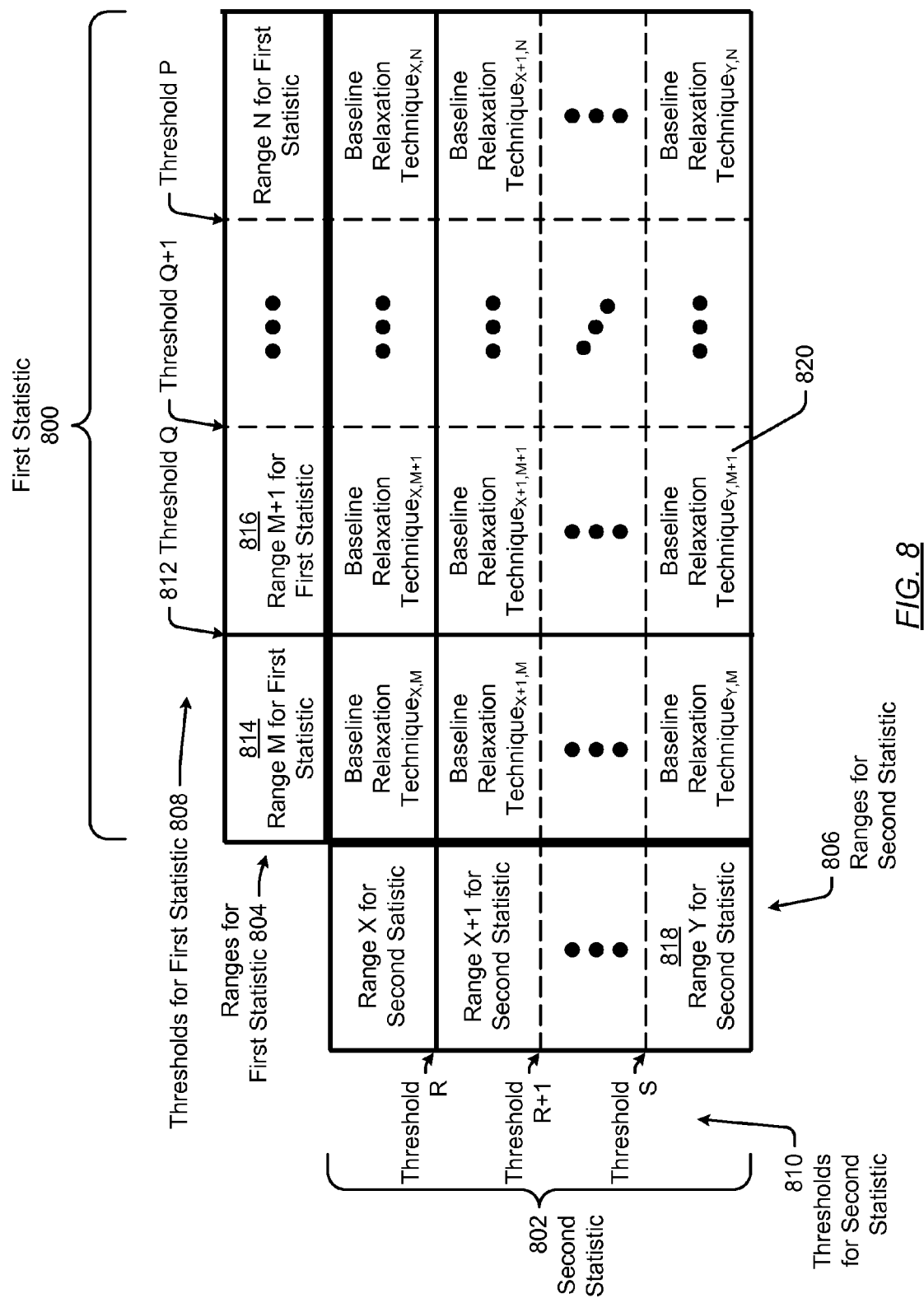
FIG. 8 shows a chart in one or more embodiments of the invention.

FIG. 8 shows a chart for selecting a baseline relaxation technique in one or more embodiments of the invention. In FIG. 8, three collinear dots mean that more elements of the same type as before and after the three collinear dots may optionally exist in accordance with one or more embodiments of the invention.

As shown in the chart, a first statistic (800) may be represented on one axis of the chart and a second statistic (802) may be represented on another axis of the chart. Although FIG. 8 shows a two-dimensional chart having only two statistics, more statistics may be added to the chart without departing from the scope of the claims. In such a scenario, the chart may include more than two dimensions. Further, the chart may include a separate dimension for each statistic.

A statistic (e.g., first statistic (800), second statistic (802)) is a single measure of an attribute of a sample. In other words, a statistic has a single value for a particular sample. The sample may be measured data values from one or more profiles. For example, the statistic may be SNR, a relative SNR (RSNR), zero order moment (ZOM), average ZOM, mean, variance, or another measure.

Each statistic may have corresponding ranges of values (e.g., ranges for first statistic (804), ranges of second statistic (806)). A range is continuous set of values. In other words, a statistic may have multiple possible values, which form a set of possible values of the statistic. A range is a continuous subset of the set of possible values. As used herein, the range of the statistic is the range in which the actual value of the statistic is located.

By way of a concrete example, and not a limitation, consider the scenario in which a statistic may have possible values between zero and one. In the example, the statistic is rounded to the hundredths. The corresponding ranges of the example statistic may be Range A is from 0 to 0.19, Range B is from 0.20 to 0.49, Range C is from 0.50 to 0.77, Range D is from 0.78 to 1. In the example, if the example statistic has a value of 0.25, then the range of the example statistic is Range B. If the example statistic has an actual value of 0.78, then the range of example statistic is range D. Although the example has uneven sizes of ranges, the ranges may be evenly sized without departing from the scope of the invention.

Continuing with FIG. 8, a range may be bounded from other ranges by thresholds (e.g., thresholds for first statistic (808), thresholds for second statistic (810)). A threshold defines where the possible values of a range end and a new range begins. In other words, the thresholds separate ranges corresponding to a statistic. For example, for the first statistic, threshold Q (812) separates range M (814) from range M+1 (816). The value of threshold Q (812) may be in range M or range M+1 (816).

Thresholds and ranges may be static or may change over time. For example, thresholds may be manually or automatically updated. By way of an example of automatic updating, as new profiles are analyzed, the new profiles may be used to gradually change the value of the thresholds for a statistic. The updating of the thresholds subsequently changes the ranges.

The ranges of the statistics define the baseline relaxation technique. Specifically, the baseline relaxation technique to apply is located at the intersection of the ranges of statistics. For example, if the range of the first statistic is range M+1 (816) and the range of the second statistic is Range Y (818), then the baseline relaxation technique to apply is Baseline Relaxation Technique$_{Y,M+1}$ (820).

Figure 9:
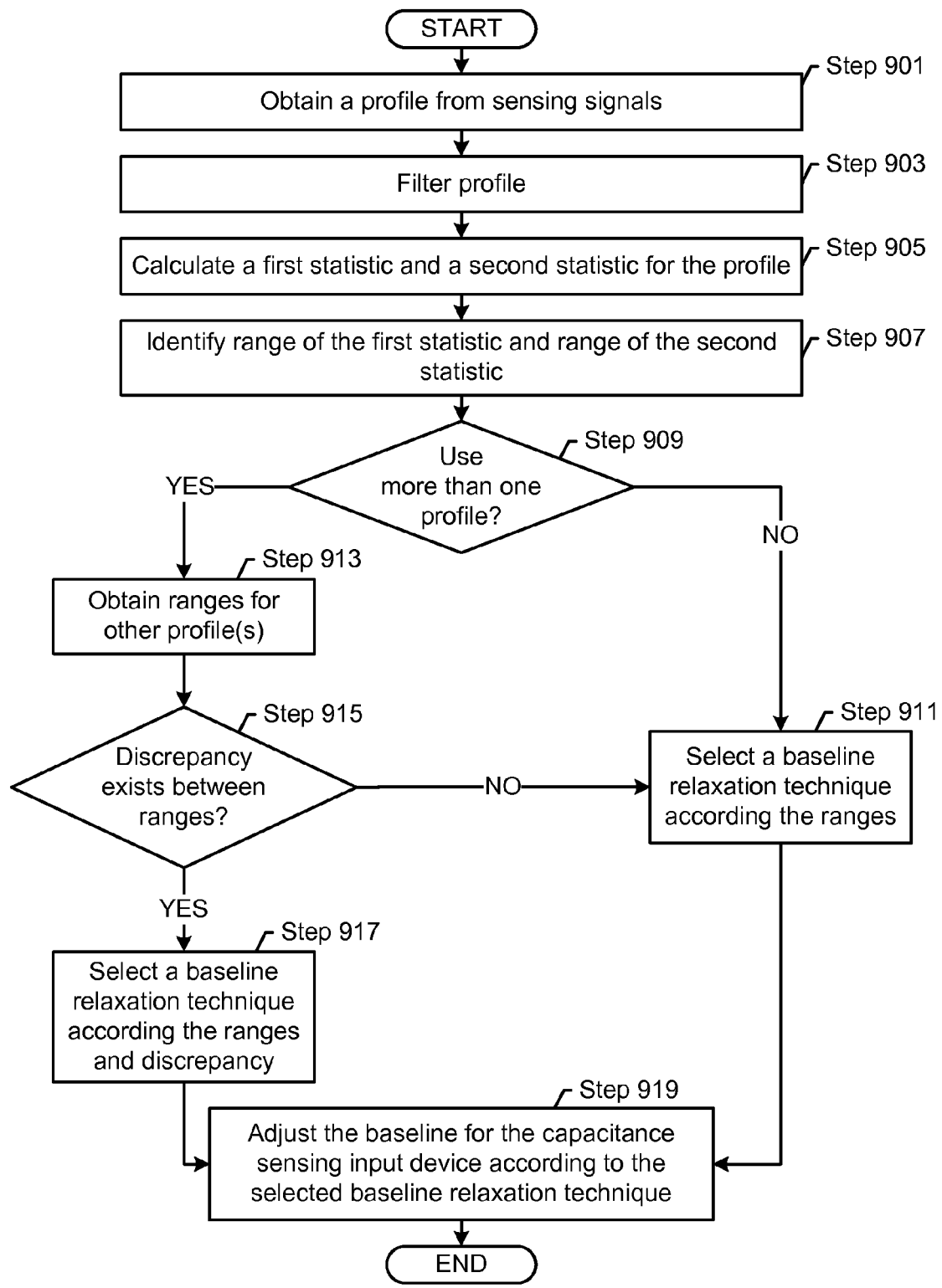
FIGS. 9-11 show flowcharts in one or more embodiments of the invention.
Figure 10A:
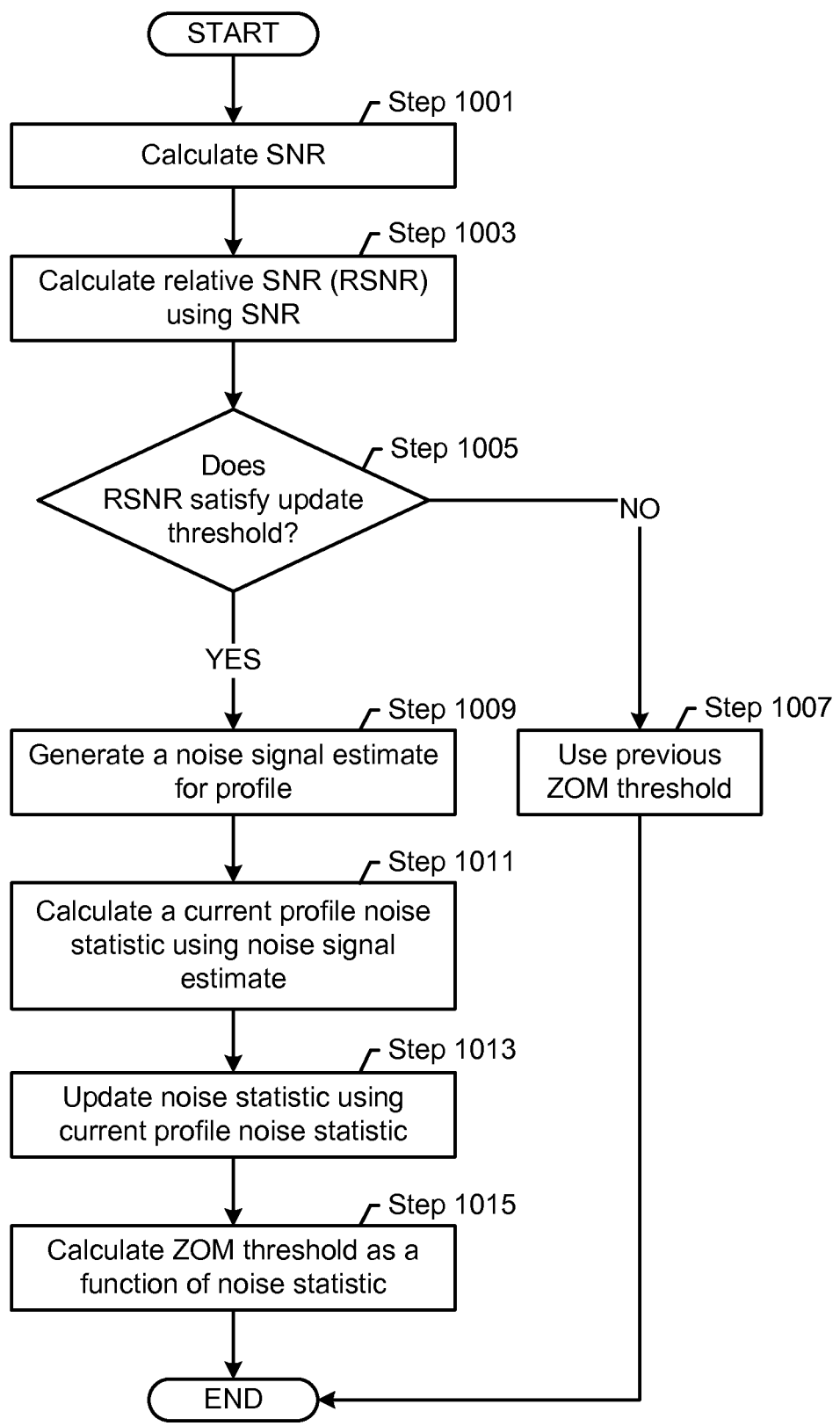
Figure 10B:
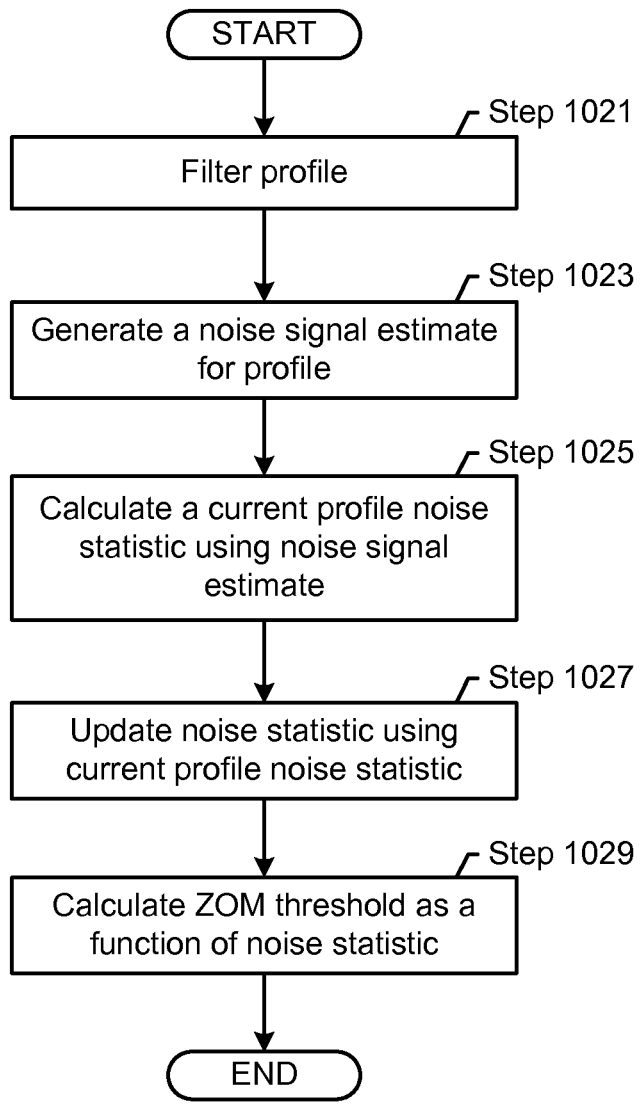
Figure 11:
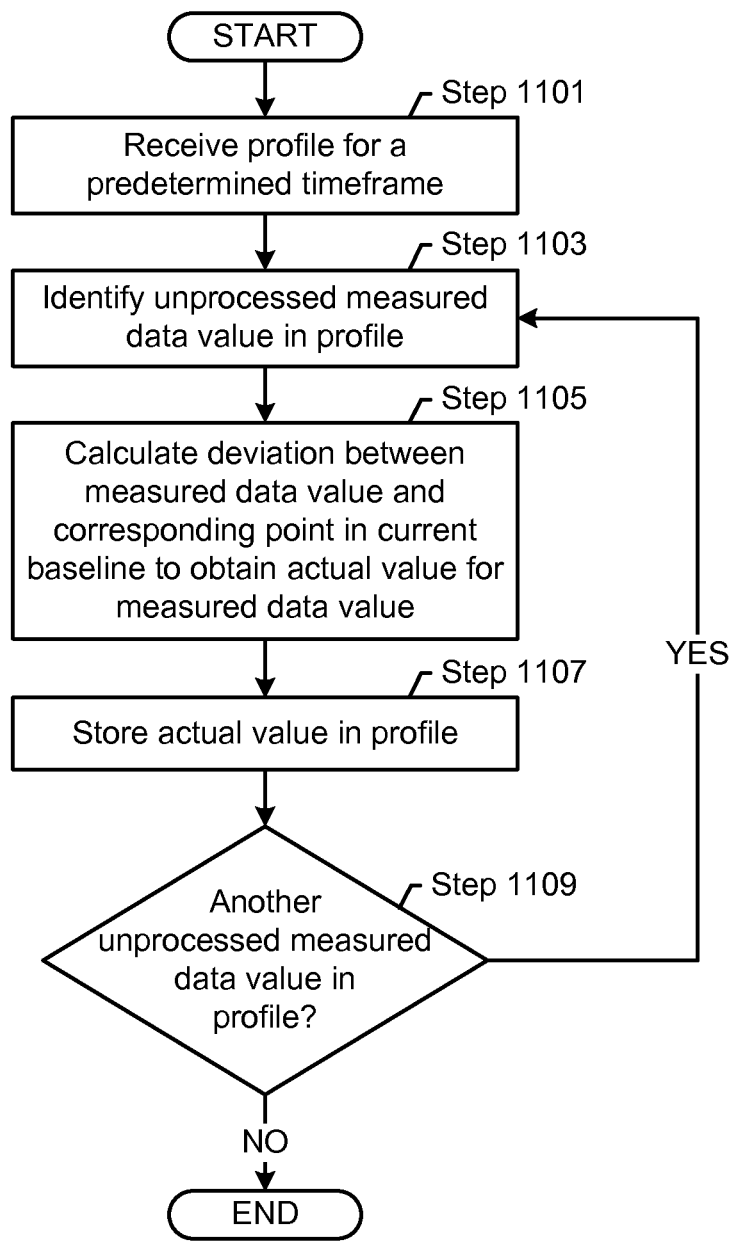

FIGS. 9-11 shows flowcharts in one or more embodiments of the invention. While the various steps in these flowcharts are presented and described sequentially, some or all of the steps may be executed in different orders, may be combined or omitted, and some or all of the steps may be executed in parallel. Furthermore, the steps may be performed actively or passively. For example, some steps may be performed using polling or be interrupt driven in accordance with one or more embodiments of the invention. By way of an example, determination steps may not require a processor to process an instruction unless an interrupt is received to signify that condition exists in accordance with one or more embodiments of the invention. As another example, determination steps may be performed by performing a test, such as checking a data value to test whether the value is consistent with the tested condition in accordance with one or more embodiments of the invention.

FIG. 9 shows a flowchart for baseline management in one or more embodiments of the invention. In Step 901, a profile is obtained from sensing signals in one or more embodiments of the invention. Obtaining a profile may include determining a measured data value corresponding to a resulting signal (or sensing signal) received with each sensor electrode. The resulting signals (or sensing signals) may be received at a single time or over a span of time. For example, the sensor electrodes may receive the resulting signals at a single time and output the corresponding measured data values at a single time. By way of another example, the sensor electrodes may receive resulting signals and output corresponding data row by row or column by column. Once the measured data values are determined, the measured data values may be grouped into the profile. Preprocessing may or may not be performed on the measured data values or on the profile before the profile is obtained in accordance with one or more embodiments of the invention.

In Step 903, the profile is filtered in one or more embodiments of the invention. Filtering the profile may be performed in a substantially similar manner to Step 203 of FIG. 2.

In Step 905, a first statistic and a second statistic are calculated for the profile. In some embodiments, the first and second statistics are independently calculated from the measured data values of the profile. In other words, the calculation of the first statistic may not be dependent on the calculation of the second statistic. Further, the calculation of the first statistic and/or the second statistic may account for previous profiles.

In Step 907, the range of the first statistic and the range of the second statistic are identified. Identifying the range of a statistic may be performed by obtaining the thresholds delimiting the ranges corresponding to the statistic. The statistic may be compared with each threshold to determine whether the value of the statistic is less than, greater than, or equal to the threshold. Based on the comparison, the range delimited by the thresholds may be determined. Not all thresholds need to be compared in one or more embodiments of the invention. For example, if the statistic is less than a first threshold having a value of 50, then the statistic is necessarily less than a second threshold having the value of 100. Thus, if the comparison is performed with the first threshold, the comparison does not need to be performed with the second threshold.

In Step 909, a determination is made whether to use more than one profile in one or more embodiments of the invention. Specifically, a determination is made whether to use more than one profile obtained for a predetermined timeframe in one or more embodiments of the invention. For example, a determination may be made to use an x-axis profile and a y-axis profile defined for the predetermined profile.

If a determination is made to use a single profile, then a baseline relaxation technique is selected based on the ranges of the statistics in Step 911. In one or more embodiments of the invention, the baseline relaxation technique is selected based on the attributes of the profile as indicated by the ranges of the statistics. For example, the statistics may indicate that an input object is in the sensing region. In such an example, the selected relaxation technique may be "no relaxation" or "slow relaxation" so that the input object in the sensing region is continually detected. By way of another example, the statistics may provide an indication of the accuracy of the baseline. In such a scenario, the selected relaxation is based on the level of accuracy. In one or more embodiments of the invention, the selected baseline relaxation technique is defined at the intersection of the ranges of the first statistic and the second statistic.

If a determination is made to use more than one profile, then ranges for the other profile(s) are obtained in Step 913. Ranges for the other profile(s) may be obtained using a similar method as discussed above in Steps 901-907.

In Step 915, a determination is made whether a discrepancy exists between the ranges in one or more embodiments of the invention. A discrepancy may exist where a range of a statistic from one profile indicates one property of the baseline or sensing region and a range of a statistic from another profile indicates a conflicting property of the baseline or sensing region. For example, a discrepancy may be deemed to exist when the range of one statistic indicates an input object is in the sensing region and the range of another statistic indicates that no input object is in the sensing region. By way of another example, a discrepancy may be deemed to exist when the range of one statistic indicates that the baseline is accurate while the range of another statistic indicates that the baseline is exceedingly inaccurate.

If a discrepancy does not exist, then the baseline relaxation technique is selected according to the ranges in Step 911. However, in Step 917, if a discrepancy exists, then the baseline relaxation technique is selected according to the ranges and the discrepancy in accordance with one or more embodiments of the invention. For example, a profile baseline relaxation technique may be selected for each profile based on the ranges. From the profile baseline relaxation techniques for the profiles, a compromise baseline relaxation technique may be selected. The compromise baseline relaxation technique may be a baseline relaxation technique that is an average of the profile baseline relaxation techniques. By way of another example, from the selected baseline relaxation techniques for the profiles, a baseline relaxation technique that updates the slowest may be selected. Other methods for selecting a baseline relaxation technique when a discrepancy exists may be used without departing from the scope of the invention.

In Step 919, the baseline for the capacitance sensing input device is adjusted according to the selected baseline relaxation technique in accordance with one or more embodiments of the invention. Specifically, for subsequent profiles, the baseline is updated. The baseline may be adjusted, based on the expected value for the current delta profile, as a function of the current delta profile over a predefined time frame. For example, "slow relaxation" and "fast relaxation" may be calculated as a weighted average of past baseline profiles and present delta profiles that have only a noise signal. By way of another example, the baseline profiles may be adjusted in a linear manner down to zero error. Other methods may be used to adjust the baseline without departing from the scope of the claims.

Although FIG. 9 shows using only a first statistic and a second statistic, additional statistics may be calculated and used to select a baseline relaxation technique without departing from the scope of the invention.

Further, as discussed above, the specific technique for calculating the first and second statistics may be dependent on the type of statistics. For example, consider the scenario in which a statistic (e.g., the first statistic, the second statistic) is RSNR. Calculating the RSNR may be performed by dividing the SNR for the profile by the detection threshold. Calculating the SNR may be performed in a substantially similar manner to the discussion related to FIGS. 4, 5A, and 5B.

By way of another example statistic, consider the scenario in which a statistic (e.g., the first statistic, the second statistic) is average ZOM. In other words, a statistic is the ZOM averaged across a time-based window of profiles. In such an example scenario, the average ZOM may be calculated by obtaining a sum of the filtered data values in the filtered profiles and dividing by the number of profiles. Eq. 20 and Eq. 21 provide example equations for calculating the average ZOM.

In Eq. 20, $D_k$ is a filtered delta profile, n is the number of data values in the profile, k is a particular time, and $ZOM_k$ is the ZOM at time k. The ZOM at time k may be calculated as follows.

$$ZOM_k = \sum_{i=1}^{n} D_k(i) \qquad \text{Eq. 20}$$

In Eq. 21, p is the number of profiles in the time window and $ZOM_k^{avg}$ is the average ZOM at time k. The average ZOM at time k may be calculated as follows.

$$ZOM_k^{ave} = \left(\sum_{j=0}^{p-1} ZOM_{k-j}\right)/p \qquad \text{Eq. 21}$$

Equations 20 and 21 are only two example equations for calculating the average ZOM. Other equations may be used without departing from the scope of the invention. Further, RSNR and average ZOM are only examples of statistics. Other statistics may be used without departing from the scope of the invention.

When the statistic is average ZOM, the thresholds for the ranges corresponding to the average ZOM may be updated. FIGS. 10A and 10B show flowcharts for dynamically updating one or more ZOM thresholds in one or more embodiments of the invention.

FIG. 10A shows a flowchart for updating the ZOM thresholds based on RSNR. In Step 1001, SNR is calculated for the current profile in accordance with one or more embodiments of the invention. Calculating the SNR may be performed in a substantially similar manner to the discussion related to FIGS. 4, 5A, and 5B.

In Step 1003, RSNR is calculated using the SNR in accordance with one or more embodiments of the invention. Calculating the RSNR may be performed by dividing the SNR for the profile by the detection threshold.

In Step 1005, a determination is made whether the RSNR satisfies an update threshold in accordance with one or more embodiments of the invention. In one or more embodiments, the ZOM threshold is not updated when an input object is in the sensing region. In such embodiments, the value of the update threshold is set to confirm that the profile used does not indicate an input object is in the sensing region. For example, the update threshold may be ten percent. In the example, the RSNR satisfies the update threshold when the RSNR is less than ten percent.

In Step 1007, if the RSNR does not satisfy an update threshold, then the previous ZOM threshold(s) are used. In one or more embodiments of the invention, the ZOM threshold(s) are not updated using the current profile.

In Step 1009, if the RSNR does satisfy an update threshold, then a noise signal estimate for the profile is generated in one or more embodiments of the invention. Generating the noise signal estimate may be performed in a substantially similar manner to the discussion related to Step 515 of FIG. 5B. An example equation for generating the noise signal estimate is presented above in Eq. 1 and Eq. 11.

In Step 1011, a current profile noise statistic is calculated using the noise estimate in one or more embodiments of the invention. Calculating the current profile noise statistic may be performed in a substantially similar manner to the discussion related to Step 517 of FIG. 5B. An example equation for generating the noise signal estimate is presented above in Eq. 2 and Eq. 12.

In Step 1013, the noise statistic is updated using the current profile noise statistic. Updating the noise statistic may be performed in a substantially similar manner to the discussion related to Step 519 of FIG. 5B. An example equation for generating the noise signal estimate is presented above in Eq. 3 and Eq. 13. As presented above, the noise statistic may be variance, average absolute deviation, standard deviation or another type of statistic. If the noise statistic is standard deviation, the noise statistic may be calculated by taking the square root of the variance, where the variance is calculated as discussed above.

In Step 1015, the ZOM threshold is calculated as a function of the noise statistic. Various techniques and equations may be used to calculate the ZOM threshold. The following are a few example equations.

An example using absolute deviation is presented in Eq. 22 below. In Eq. 22, ZOMthreshold is the ZOM threshold, s is a scale factor, Dev is the noise absolute deviation, and n is the number of positions as defined by number of sensor electrodes that capture measured data values for the profile.

$$ZOMthreshold = s \times \left( \min\left(1, \sqrt{\frac{\pi}{2}} \times Dev\right) \right) \times n \qquad \text{Eq. 22}$$

An example using variance is presented in Eq. 23 below. In Eq. 23, ZOMthreshold is the ZOM threshold, s is a scale factor, Var is noise variance, and n is the number of positions as defined by number of sensor electrodes that capture measured data values for the profile.

$$ZOMthreshold = s \times \sqrt{(\min(1, Var))} \times n \qquad \text{Eq. 23}$$

In the above equations, the ZOM threshold is set to a level such that more than the scale factor multiples of the noise deviation or variance applied over the whole profile is required to exceed to the ZOM threshold. In one or more embodiments of the invention, the above ZOM thresholds are positive values. Another ZOM threshold may be set as zero.

FIG. 10B shows another method for calculating one or more ZOM thresholds in accordance with one or more embodiments of the invention. In Step 1021, the profile is filtered in one or more embodiments of the invention. Filtering the profile may be performed in a substantially similar manner to the discussion related to Step 513 of FIG. 5B. In Step 1023, a noise estimate for the profile is calculated. A current profile noise statistic may be calculated using the noise signal estimate in Step 1025. Using the current profile noise statistic, the noise statistic may be updated in Step 1027. In Step 1029, the ZOM threshold may be calculated as a function of the noise statistic. Step 1023, Step 1025, Step 1027, and Step 1029 may each be performed in a substantially similar manner to the discussion related to Step 1009, Step 1011, Step 1013, and Step 1015, respectively, in FIG. 10A.

FIG. 11 shows a flowchart for using a baseline in one or more embodiments of the invention. Specifically, FIG. 11 shows how a current baseline, adjusted based on the current relaxation method, may be used to adjust the profile based on expected noise. The resulting profile may be referred to as a profile that is preprocessed or a delta profile in accordance with one or more embodiments of the invention. In Step 1101, a profile is received for a predetermined timeframe. In one or more embodiments of the invention, the profile is received from sensor electrodes that measure the capacitance. In Step 1103, an unprocessed measured data value is identified in the profile. A measured data value is unprocessed when the measured data value has not yet been adjusted for the current baseline.

In Step 1105, the deviation between the measured data value and the corresponding point in the current baseline is calculated to obtain an actual value for the measured data value in accordance with one or more embodiments of the invention. Specifically, as discussed above, for each sensor electrode that measures a data value in the profile, the baseline includes an estimate of the background capacitance for the particular sensor electrode in one or more embodiments of the invention. Thus, each measured data value has a corresponding point, as defined by the sensor electrode, in the baseline. The difference between the measured data value and the value of the corresponding point is the actual value in one or more embodiments of the invention. In Step 1107, the actual value is stored in the profile in accordance with one or more embodiments of the invention.

In Step 1109, a determination is made whether another unprocessed measured data value exists in the profile. If another unprocessed measured data value exists, then the method repeats with Step 1103 to process the next unprocessed measured data value.

Figure 12:
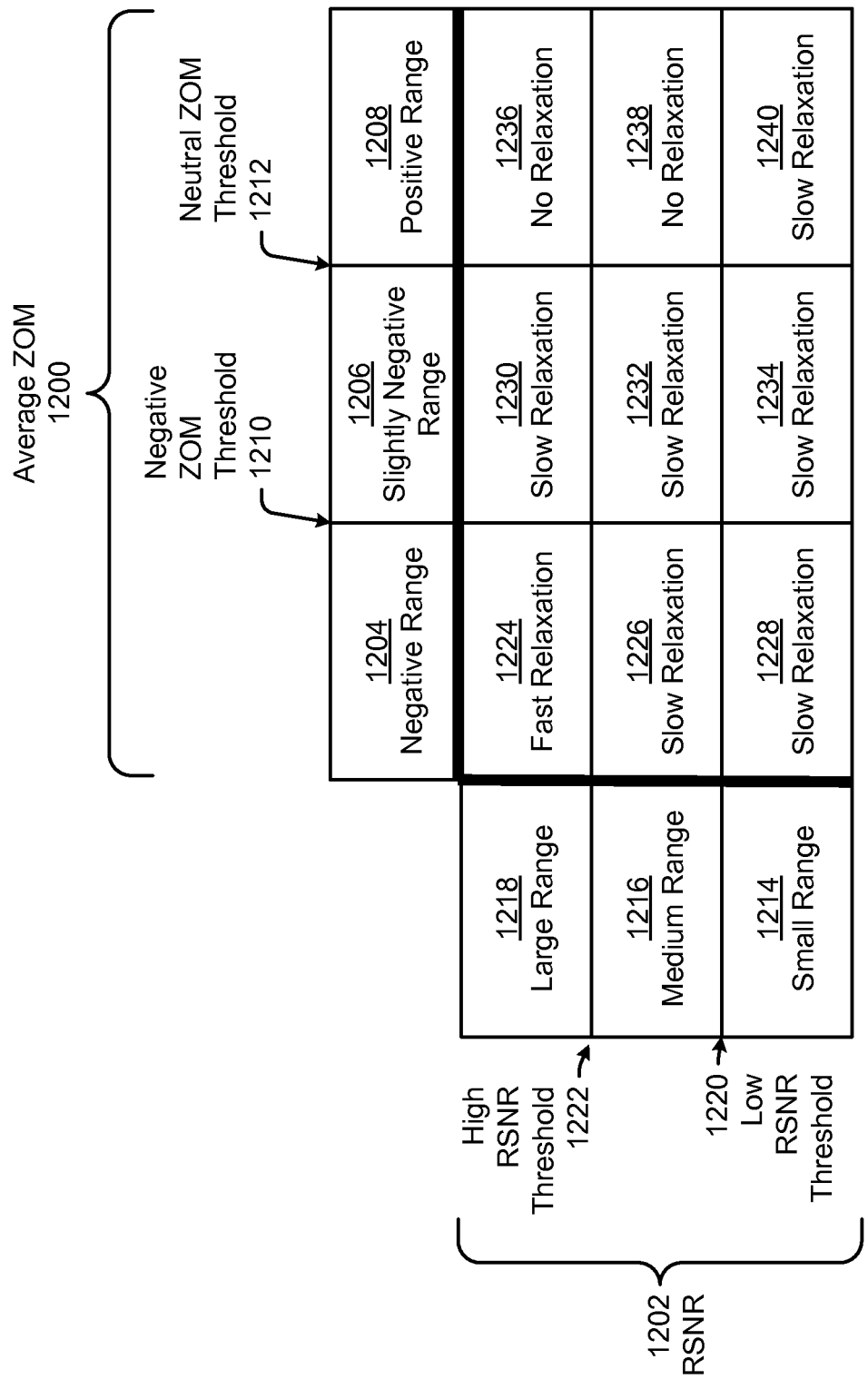
FIG. 12 shows an example chart in one or more embodiments of the invention.

FIG. 12 shows an example chart for baseline management in one or more embodiments of the invention. Specifically, FIG. 12 shows an example in which average ZOM (1200) and RSNR (1202) are used as the statistics. The average ZOM indicates the deviation of the profile from zero. The RSNR indicates whether an input object is in the sensing region. The greater the likelihood that the input object is in the sensing region based on the capacitance, the higher the RSNR.

As shown in example FIG. 12, the average ZOM (1200) may have ranges, such as negative range (1204), slightly negative range (1206), and positive range (1208). A negative ZOM threshold (1210) may separate the negative range (1204) from the slightly negative range (1206). The negative ZOM threshold may be set, for example, as a function of the profile noise signal statistic by a static multiple of the estimate of the noise standard deviation as discussed above. Further, a neutral ZOM threshold (1212) may separate the slightly negative range (1206) from the positive range (1208). The neutral ZOM threshold (1212) may be set at zero, for example.

In addition, as shown in example FIG. 12, the RSNR (1202) may have ranges, such as small range (1214), medium range (1216), and large range (1218). A low RSNR threshold (1220) may separate the small range (1214) from the medium range (1216). By way of an example of the low RSNR threshold, a value of 0.25 may be used as the low RSNR threshold. Other values may be used in the example without departing from the scope of the invention.

A high RSNR threshold (1222) may separate the medium range (1216) from the high range (1218). By way of an example of the high RSNR threshold, a value of 0.75 may be used as the high RSNR threshold. Other values may be used in the example without departing from the scope of the invention.

In the example, negative average ZOM (e.g., an average ZOM in the slightly negative range (1206) or negative range (1204)) may indicate that the current baseline is not an accurate estimate of the background capacitance. In such a scenario, a "slow relaxation" may be performed as indicated in blocks (1226, 1228, 1230, 1232, and 1234). A negative average ZOM that is in the negative range (1204) with a large RSNR (i.e., an RSNR in the large range (1218)) may indicate that the estimate of the background capacitance is severely inaccurate. In such a scenario, a "fast relaxation" may be performed as indicated in block (1224).

A positive average ZOM (i.e., an average ZOM in the positive range (1208)) and an RSNR in the medium range (1216) or large range (1218) may indicate than an input object is in the sensing region. In such a scenario, no relaxation may be performed as indicated in blocks (1236 and 1238).

An average ZOM in the positive range (1208) and an RSNR in the small range (1214) may indicate that the baseline is slightly inaccurate. In such a scenario, a "slow relaxation" as indicated in block (1240) may be performed.

The following are example techniques for performing "slow relaxation" and "fast relaxation" in one or more embodiments of the invention. "Slow relaxation" may be performed as follows. The relax rate may be set at 1 fF/second. Relax amounts may be set as equal to sign(delta) times the minimum of the relax rate and the absolute value of delta, where delta represents the values in the baseline adjusted 'delta' profile. The baseline may be adjusted by adding the current baseline to the relax amount to obtain a new baseline.

"Fast relaxation" may be performed by relaxing over a fixed number of profile frames (referred to below as "f"). For example, the correction at frame k, k=0, 1, ... f−1, may be calculated as the minimum of 1/(f−k) multiplied by the maximum error. By way of another example of "fast relaxation", the correction may be calculated and applied at the end of f frames as the average of errors over the f frames. By way of another example of "fast relaxation", the adjustment to the baseline may be performed similar to the method discussed above for "slow relaxation", but at a faster rate.

Figure 13:
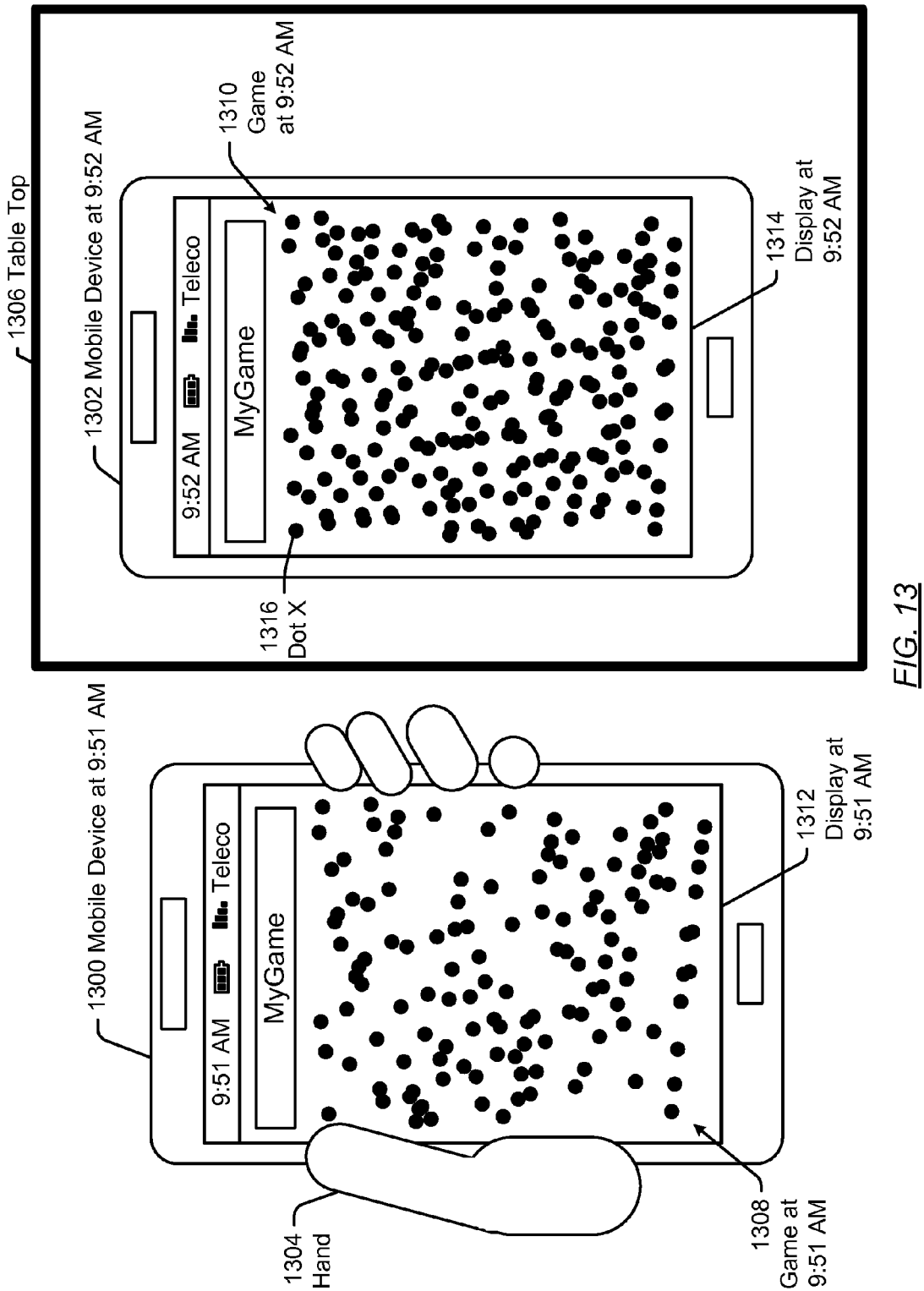
FIG. 13 shows an example in one or more embodiments of the invention.

The following is for example purposes only and not intended to limit the scope of the invention. In the following example, consider the scenario in which baseline adjustment is performed in accordance with the chart shown in FIG. 12. FIG. 13 shows an example of how a baseline may need to be adjusted according to a baseline relaxation technique in one or more embodiments of the invention. In the example, consider the scenario in which a user, Jack, is playing a game (e.g., game at 9:51 AM (1308), game at 9:52 AM (1310)) on the Jack's mobile device (e.g., mobile device at 9:51 AM (1300), mobile device at 9:52 AM (1302)). In the game, the user is to select individual dots in the display (e.g., display at 9:51 AM (1312), display at 9:52 AM (1314)).

At 9:51 AM, Jack holds the mobile device (1300) in his hand. As he is holding the mobile device (1300), a portion of his hand (1304) may be over the display (1312) while he uses a stylus to select dots in the game (1308). Because of placement of the hand (1304), the background capacitance received by the sensor electrodes located at the edges is higher than in the background capacitance received by the sensor electrodes in the middle. To ensure that the portion of his hand (1304) is not detected as an input object, the baseline may include increased values at the edges that estimate the background capacitance due to the hand (1304).

Continuing with the example, at 9:52 AM, Jack places the mobile device (1302) on a tabletop (1306). Immediately, upon placement on the tablet (1306) and removal of the hand (1304), the background capacitance caused by the placement of the hand (1306) is non-existent. Thus, a profile that is preprocessed using the baseline from 9:51 AM may include negative values on the edges. Because of the negative values, with no baseline adjustment, if Jack selects dot X (1316) in the display (1314), the selection may not be detected, which is not an acceptable result.

Continuing with the example, baseline adjustment may be performed, for example, using average ZOM and RSNR. The average ZOM calculated with such a profile as when Jack selects dot X (1316) may be in the negative range. Because Jack selected the dot by touching the stylus to the surface sensing region of the display (1314), the RSNR is in the high range. Based on the example chart in FIG. 12, a fast relaxation is performed as indicated in block (1224). Because the selected baseline relaxation technique is fast, the game will quickly begin responding to Jack's input. Thus, Jack may continue his enjoyable game playing experience.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A processing system for baseline management, comprising:
    a sensor module comprising sensor circuitry coupled to a plurality of sensor electrodes, the sensor module configured to receive resulting signals with at least a portion of the sensor electrodes; and
    a determination module operatively connected to the plurality of sensor electrodes and configured to:
        obtain a first profile from the resulting signals;
        calculate, using the first profile, a first statistic and a second statistic for the first profile;
        select, according to a first range of the first statistic and a second range of the second statistic, a baseline relaxation technique from a plurality of baseline relaxation techniques to obtain a selected baseline relaxation technique; and
        adjust a baseline for the capacitance sensing input device according to the selected baseline relaxation technique.

2. The processing system of claim 1, wherein calculating the first statistic comprises:
    calculating a noise statistic for the predetermined timeframe;
    calculating a data signal statistic for the predetermined timeframe using the first profile;
    calculating a signal to noise ratio (SNR) by dividing the data signal statistic by the noise statistic; and
    dividing the SNR by a detection threshold to obtain a relative SNR (RSNR),
    wherein the RSNR is the first statistic.

3. The processing system of claim 2, wherein the second statistic comprises a zero order moment (ZOM) of the first profile.

4. The processing system of claim 3, selecting the baseline relaxation technique comprises:
    selecting one of a fast baseline relaxation and a slow baseline relaxation based on a comparison of the RSNR to a high RSNR threshold and a low RSNR threshold and a comparison of the ZOM to a positive ZOM threshold and a negative ZOM threshold.

5. The processing system of claim 3, wherein the second range of the ZOM is defined by a plurality of ZOM thresholds, wherein the plurality of ZOM thresholds are periodically updated using a plurality of profiles.

6. The processing system of claim 1, wherein the plurality of baseline relaxation techniques comprises a variety of baseline relaxation speeds defining how quickly to adjust the sensing baseline.

7. The processing system of claim 1, wherein the first profile is obtained for the first axis of the capacitance sensing input device, and wherein the determination module is further configured to:
    obtain a second profile for a second axis of the capacitance sensing input device; and
    calculate, using the second profile, a third statistic and a fourth statistic for the second profile,
    wherein selecting the baseline relaxation technique is further performed according to a third range of the third statistic and a fourth range of the fourth statistic.

8. The processing system of claim 7, wherein the determination module is further configured to:
    detect a discrepancy between the first range and the third range,
    wherein selecting the selected baseline relaxation technique is based on the discrepancy.

9. A method for baseline management for a capacitive sensing device, comprising:
   obtaining a first profile from sensing signals received with a plurality of sensor electrodes of the capacitance sensing input device;
   calculating, using the first profile, a first statistic and a second statistic for the first profile;
   selecting, according to a first range of the first statistic and a second range of the second statistic, a baseline relaxation technique from a plurality of baseline relaxation techniques to obtain a selected baseline relaxation technique; and
   adjusting a baseline for the capacitance sensing input device according to the selected baseline relaxation technique.

10. The method of claim 9, wherein calculating the first statistic comprises:
   calculating a noise statistic for the predetermined timeframe;
   calculating a data signal statistic for the predetermined timeframe using the first profile;
   calculating a signal to noise ratio (SNR) by dividing the data signal statistic by the noise statistic; and
   dividing the SNR by a detection threshold to obtain a relative SNR (RSNR),
   wherein the RSNR is the first statistic.

11. The method of claim 10, wherein the second statistic comprises a zero order moment (ZOM) of the first profile.

12. The method of claim 11, selecting the baseline relaxation technique comprises:
   selecting one of a fast baseline relaxation and a slow baseline relaxation based on a comparison of the RSNR to a high RSNR threshold and a low RSNR threshold and a comparison of the ZOM to a positive ZOM threshold and a negative ZOM threshold.

13. The method of claim 11, wherein the second range of the ZOM is defined by a plurality of ZOM thresholds, wherein the plurality of ZOM thresholds are periodically updated using a plurality of profiles.

14. The method of claim 9, wherein the plurality of baseline relaxation techniques comprises a variety of baseline relaxation speeds defining how quickly to adjust the sensing baseline.

15. The method of claim 9, wherein the first profile is obtained for the first axis of the capacitance sensing input device, and wherein the method further comprises:
   obtaining a second profile for a second axis of the capacitance sensing input device; and
   calculating, using the second profile, a third statistic and a fourth statistic for the second profile,
   wherein selecting the baseline relaxation technique is further performed according to a third range of the third statistic and a fourth range of the fourth statistic.

16. The method of claim 15, further comprising:
   detect a discrepancy between the first range and the third range,
   wherein selecting the selected baseline relaxation technique is based on the discrepancy.

17. An input device comprising:
   a plurality of sensor electrodes configured to receive sensing signals; and
   a processing system operatively connected to the plurality of sensor electrodes and configured to:
      obtain a profile from the resulting signals;
      calculate, using the profile, a first statistic and a second statistic for the profile;
      select, according to a first range of the first statistic and a second range of the second statistic, a baseline relaxation technique from a plurality of baseline relaxation techniques to obtain a selected baseline relaxation technique; and
      adjust a baseline for the capacitance sensing input device according to the selected baseline relaxation technique.

18. The input device of claim 17, wherein calculating the first statistic comprises:
   calculating a noise statistic for a predetermined timeframe;
   calculating a data signal statistic for the predetermined timeframe using the profile;
   calculating a signal to noise ratio (SNR) by dividing the data signal statistic by the noise statistic; and
   dividing the SNR by a detection threshold to obtain a relative SNR (RSNR),
   wherein the RSNR is the first statistic.

19. The input device of claim 18, wherein the second statistic comprises a zero order moment (ZOM) of the first profile.

20. The input device of claim 19, wherein the second range of the ZOM is defined by a plurality of ZOM thresholds, wherein the plurality of ZOM thresholds are periodically updated using a plurality of profiles.

* * * * *